US009356013B2

(12) United States Patent
Shrivastava et al.

(10) Patent No.: US 9,356,013 B2
(45) Date of Patent: May 31, 2016

(54) SEMICONDUCTOR DEVICES AND ARRANGEMENTS FOR ELECTROSTATIC (ESD) PROTECTION

(71) Applicant: INTEL IP CORPORATION, Santa Clara, CA (US)

(72) Inventors: Mayank Shrivastava, Unterhaching (DE); Christian Russ, Diedorf (DE)

(73) Assignee: Intel IP Corporation, Santa Clara, CA (US)

( * ) Notice: Subject to any disclaimer, the term of this patent is extended or adjusted under 35 U.S.C. 154(b) by 24 days.

(21) Appl. No.: 13/935,594

(22) Filed: Jul. 5, 2013

(65) Prior Publication Data

US 2015/0008476 A1    Jan. 8, 2015

(51) Int. Cl.
*H01L 29/66*    (2006.01)
*H01L 27/02*    (2006.01)

(52) U.S. Cl.
CPC .................. *H01L 27/0262* (2013.01)

(58) Field of Classification Search
CPC .. H01L 27/02; H01L 27/0262; H01L 27/0266
USPC ........................................................ 257/133
See application file for complete search history.

(56) References Cited

U.S. PATENT DOCUMENTS

| 6,909,149 | B2 | 6/2005 | Russ et al. |
| 7,638,370 | B2 | 12/2009 | Gossner et al. |
| 7,800,128 | B2 | 9/2010 | Domanski et al. |
| 2005/0212051 | A1 | 9/2005 | Jozwiak et al. |
| 2006/0011939 | A1 | 1/2006 | Mohn et al. |
| 2007/0262386 | A1* | 11/2007 | Gossner et al. ............... 257/355 |
| 2009/0206367 | A1 | 8/2009 | Gauthier, Jr. et al. |
| 2010/0207161 | A1 | 8/2010 | Shrivastava et al. |

\* cited by examiner

*Primary Examiner* — Matthew Gordon
(74) *Attorney, Agent, or Firm* — Viering, Jentschura & Partner

(57) ABSTRACT

A semiconductor device including: a first semiconductor region of a first conductivity type; a second semiconductor region of a second conductivity type adjacent to the first region; third and fourth semiconductor regions of the second conductivity type over or at least partially within the first semiconductor region; a fifth semiconductor region of the first conductivity type between the third and fourth semiconductor regions; a first gate over the fifth semiconductor region; sixth and seventh semiconductor regions of the first conductivity type over or at least partially within the second semiconductor region; an eighth semiconductor region of the second conductivity type between the sixth and seventh semiconductor regions; a second gate over the eighth semiconductor region; the third and seventh semiconductor regions coupled to first and second regions of the first gate, respectively, and the fourth and sixth semiconductor regions coupled to first and second regions of the second gate, respectively.

13 Claims, 8 Drawing Sheets

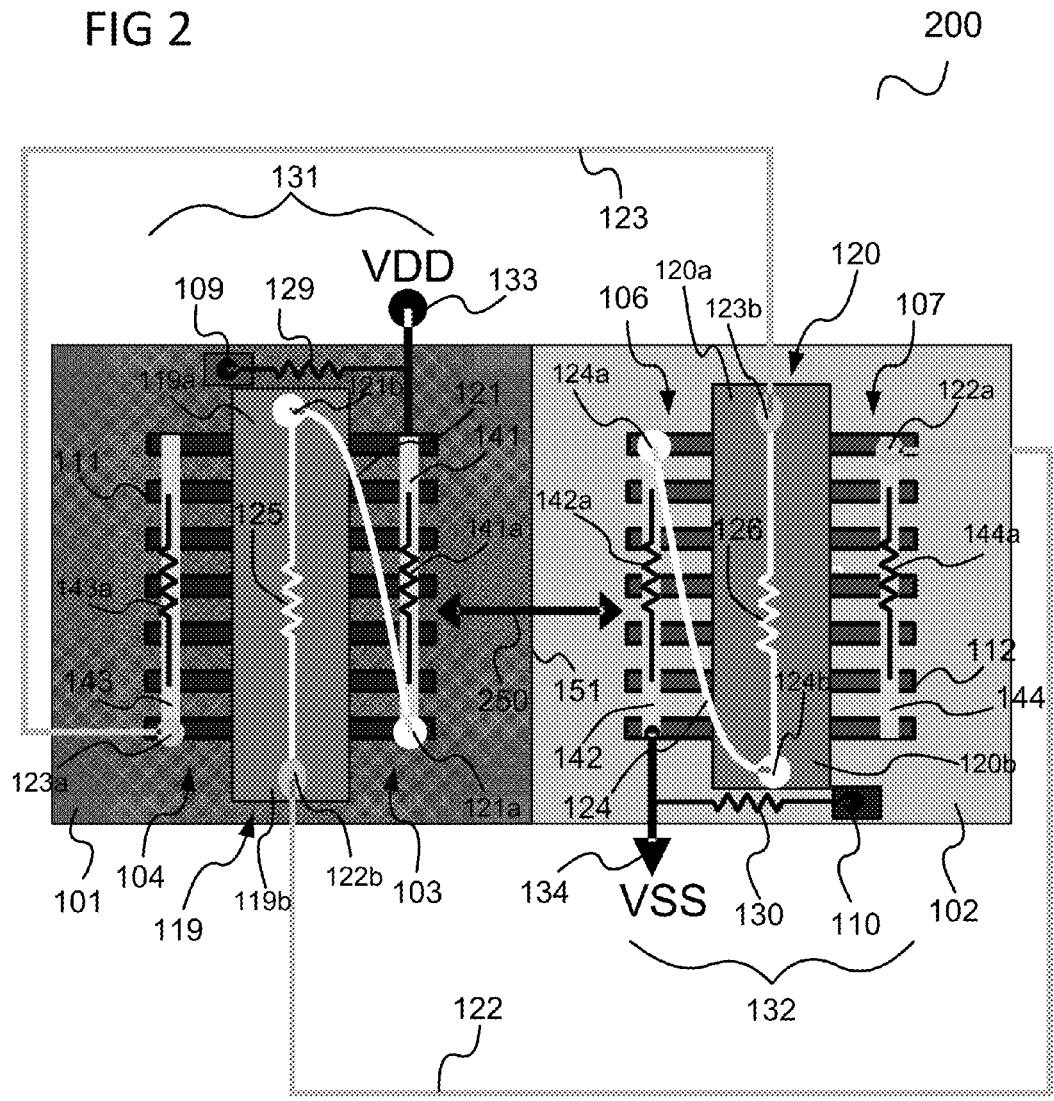

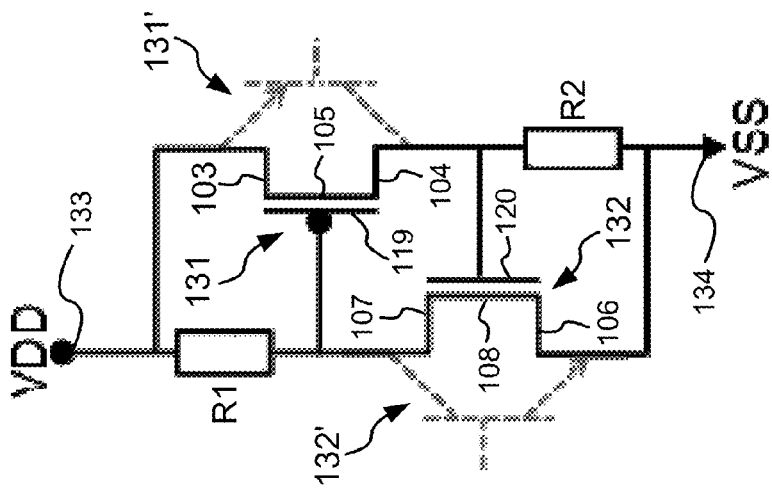
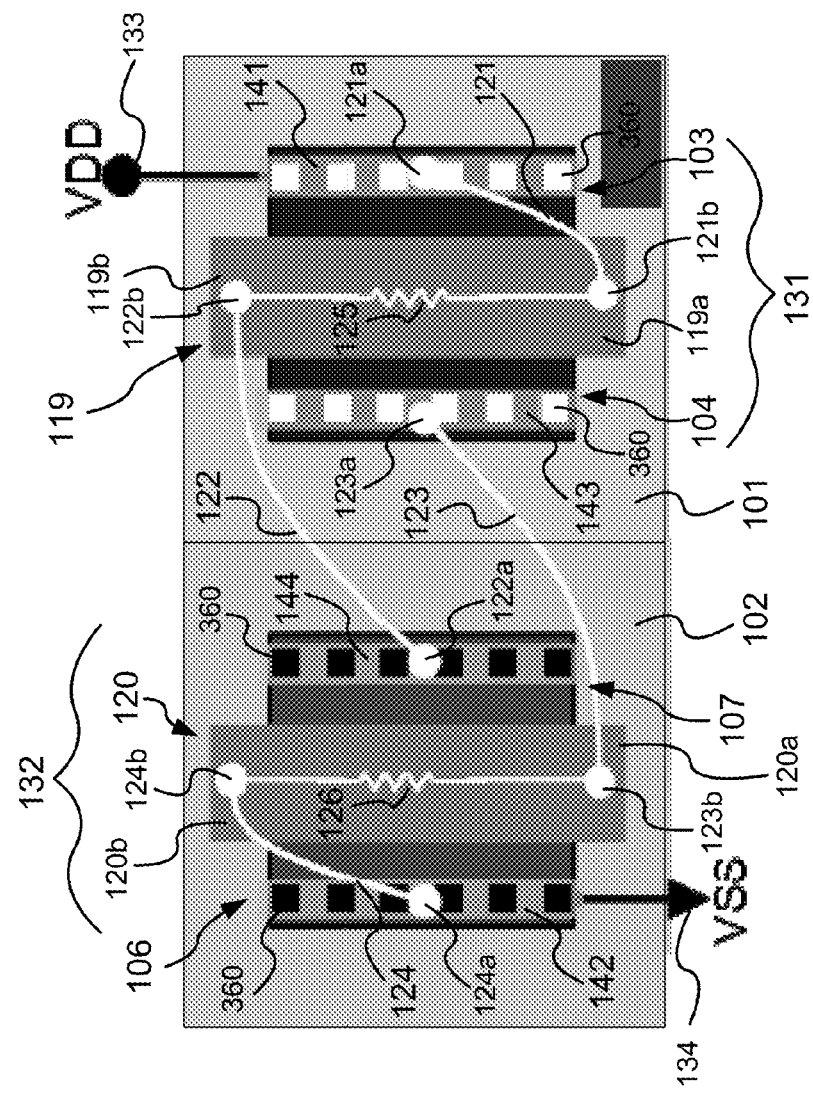
FIG 3A
FIG 3B

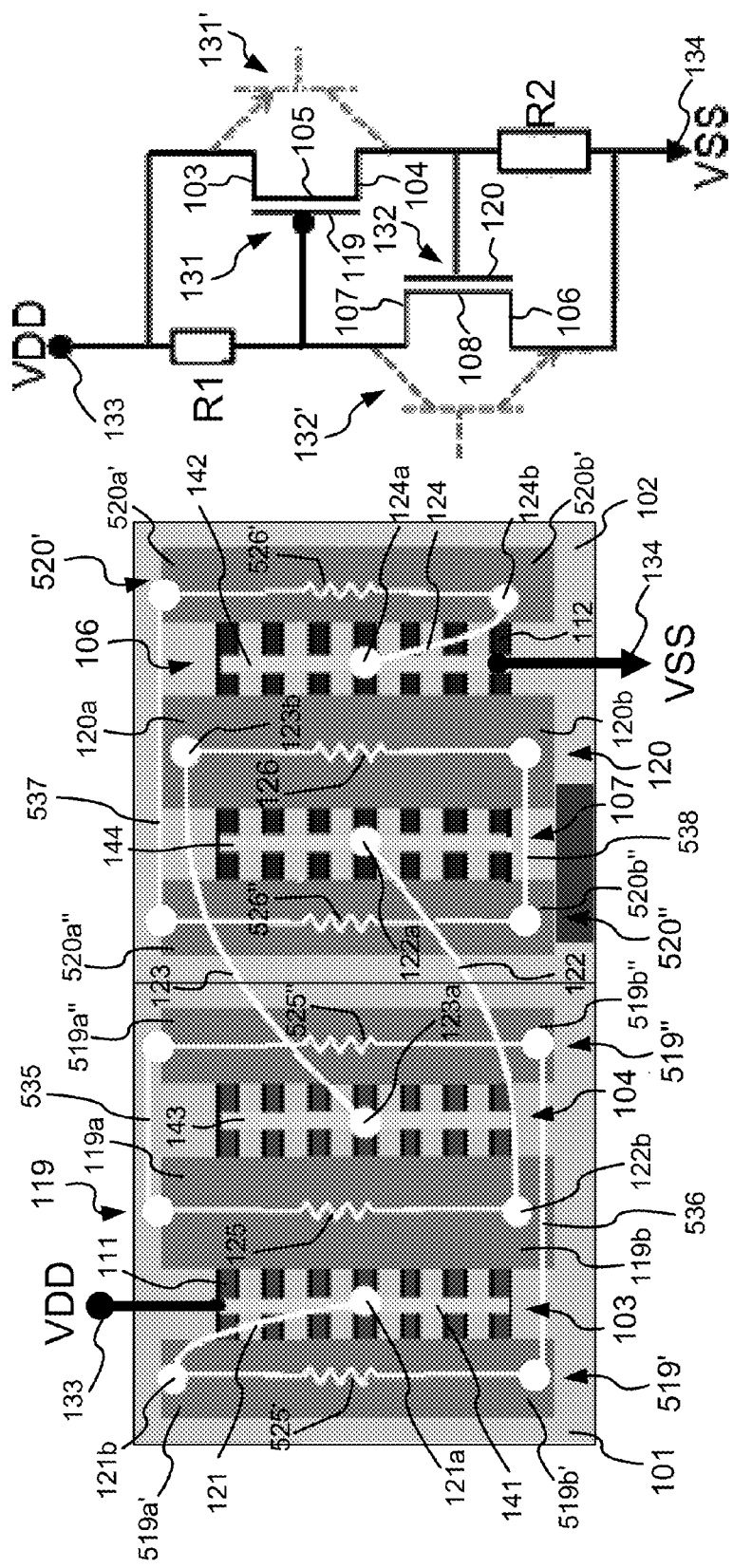

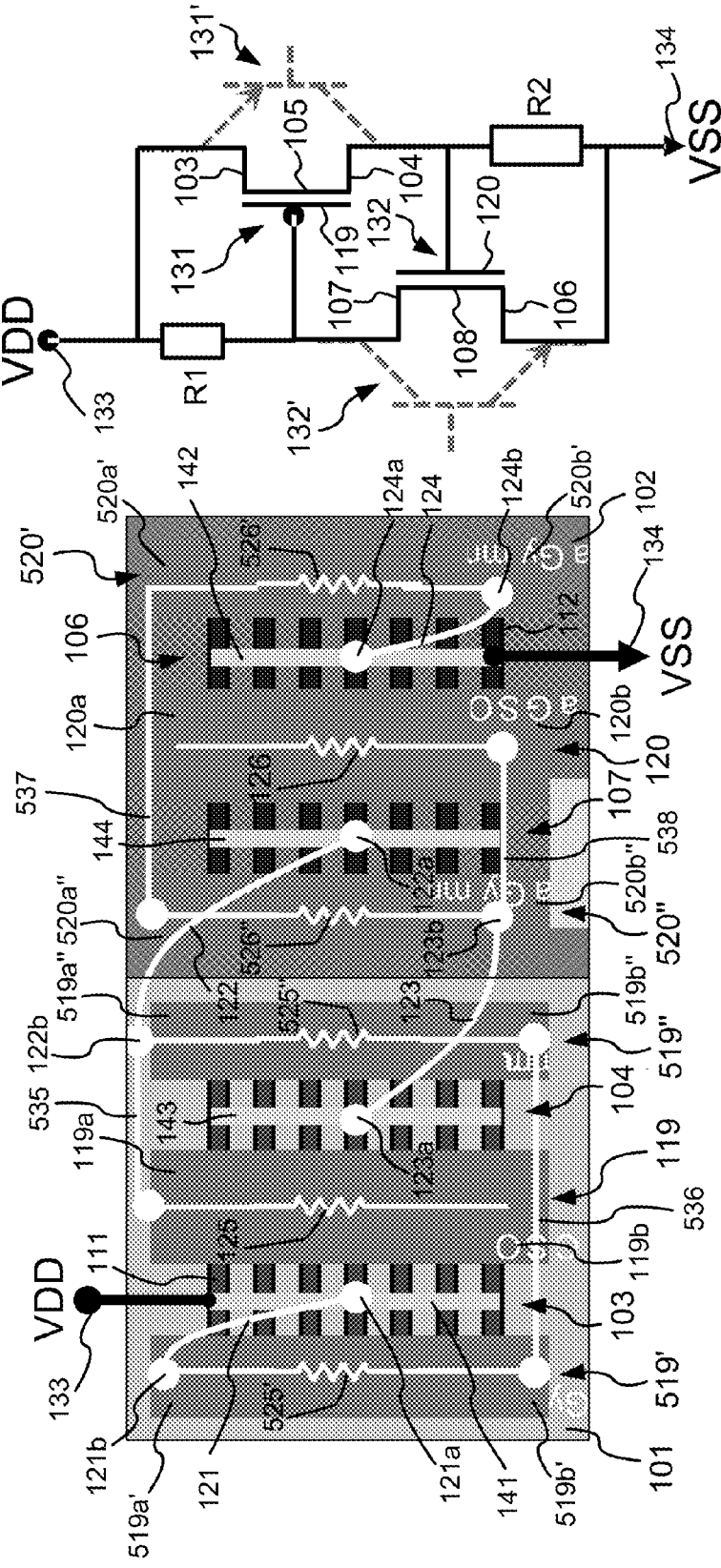

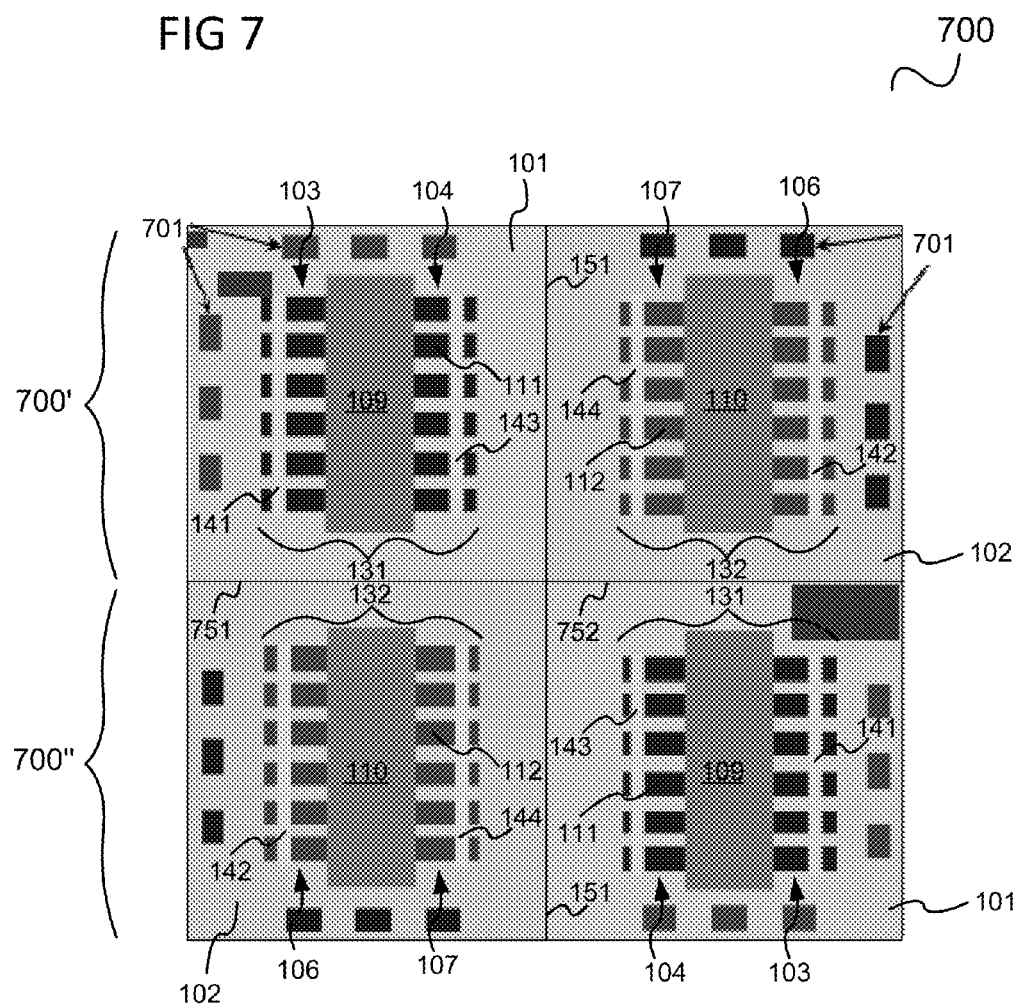

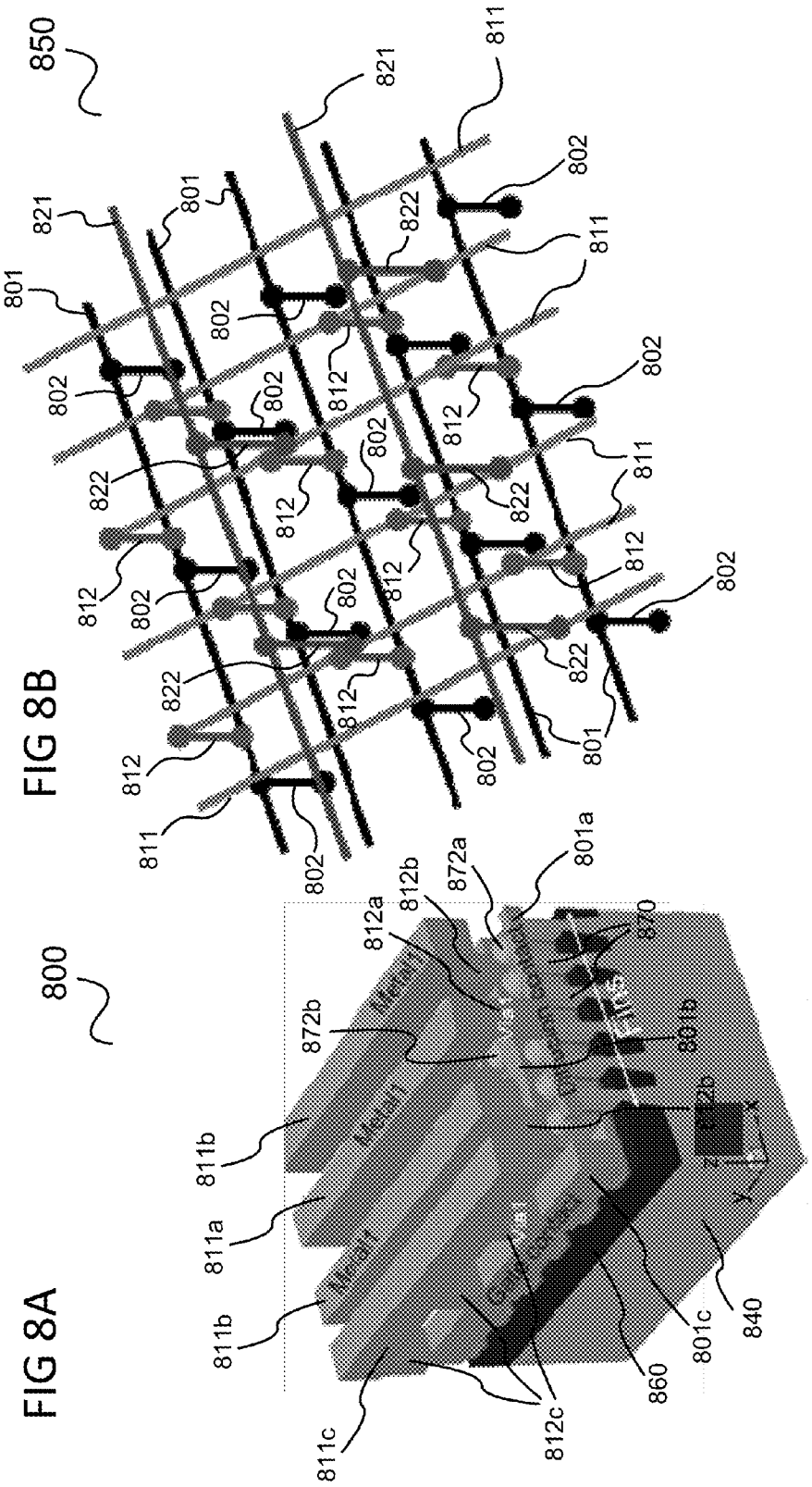

SEMICONDUCTOR DEVICES AND ARRANGEMENTS FOR ELECTROSTATIC (ESD) PROTECTION

TECHNICAL FIELD

Various aspects relate to semiconductor devices and arrangements.

BACKGROUND

As planar bulk MOS (Metal Oxide Semiconductor) devices are known to reach the scaling limits, fin field effect transistors (FinFETs) or Trigate FETs have become popular in recent days as a technology option for sub 20 nm node gate lengths. Moreover, FinFETs may be a suitable option for System on Chip (SoC) application, which may be indeed a key requirement for reduced cost, size and power while enjoying better performance in the technologies below the 20 nm node. A SoC chip in advanced CMOS (Complementary Metal Oxide Semiconductor) may commonly consist of various blocks including robust electrostatic discharge (ESD) protection. Current ballasting may be used to achieve uniform conduction in the fragile fins.

SCRs (Semiconductor Controlled Rectifiers) in advanced CMOS are among those devices, which may be used for a robust ESD protection. It may be desirable to apply current ballasting techniques with SCR devices for, e.g., bulk FinFET technologies in order to achieve, e.g., efficient and robust ESD protection capabilities.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of this disclosure are described with reference to the following drawings, in which:

FIG. 2 shows a top view of a semiconductor device having a reduced spacing between an anode region and a cathode region;

FIG. 3A and FIG. 3B show a top view and a circuit view, respectively, of a semiconductor device based on planar technology;

FIG. 5A and FIG. 5B show a top view and a circuit view, respectively, of a semiconductor device utilizing dummy gates;

FIG. 6A and FIG. 6B show a top view and a circuit view, respectively, of another semiconductor device utilizing dummy gates, where only the dummy gates are used for ballasting purposes;

FIG. 7 a top view of a semiconductor arrangement including two semiconductor devices arranged in a staggered configuration;

FIG. 8A and FIG. 8B are views illustrating a gridded metallization approach for improved current ballasting.

DESCRIPTION

Figure 1A:
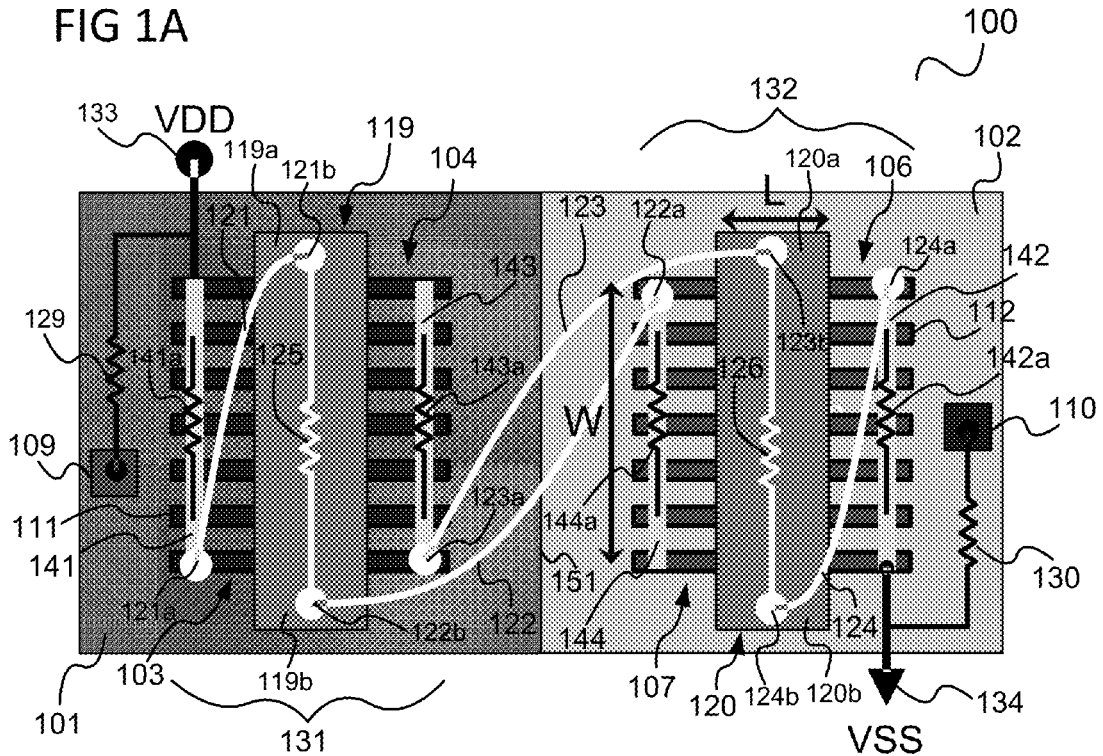
FIG. 1A and FIG. 1B show a top view and a circuit view, respectively, of a semiconductor device according to various aspects of this disclosure.

The following detailed description refers to the accompanying drawings that show, by way of illustration, specific details and aspects of this disclosure in which the invention may be practiced. These aspects are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

The terms "coupling" or "connection" as used herein may be understood to include both a direct "coupling" or "connection" and an indirect "coupling" or "connection".

The term "disposed over" as used herein may be understood to include both the case that a first feature, layer, region, etc., may be disposed "directly on", e.g. in direct contact with, a second feature, layer, region, etc., and the case that the first feature, layer, region, etc., is disposed "indirectly on" the second feature, layer, region, etc., with one or more additional features, layers, regions, etc., being arranged between the first feature, layer, region, etc., and the second feature, layer, region, etc.

Various aspects of this disclosure relate to current ballasting techniques combined with a novel SCR device for bulk FinFET technologies in order to achieve efficient and robust ESD protection capabilities.

A current ballasting technique and a novel SCR device for bulk FinFET technology are described, which may have one or more (e.g. all) of the following effects:

1. Compatibility with existing bulk FinFET process flow and complexity.
2. Cost and area efficiency.
3. Low trigger voltage and low on-resistance.
4. Fast turn-on.
5. HBM (Human Body Model) and CDM (Charged Device Model) robustness from one clamp.
6. No serious degradation or sacrifices by parasitic elements.

According to various examples, a FinFET technology based CMOS SCR integrated with Bipolar SCR device for ESD clamping is provided, which consists of NMOS and PMOS devices connected in a cross-coupled fashion such that they form a CMOS SCR. Additionally, an inherent parasitic bipolar SCR may be also present, as will be described in further detail below, see e.g. FIG. 1A and FIG. 1B.

According to various examples, the CMOS SCR may be implemented in a bulk FinFET technology. However, other FinFET technologies, e.g. an SOI FinFET technology, or a planar technology may be used as well for implementation of the CMOS SCR.

According to various examples, an NMOS gate resistor and a PMOS gate resistor may be connected such that the PMOS gate resistor acts as a ballast resistor for the NMOS device and the NMOS gate resistor acts as a ballast resistor for the PMOS device, as will be described in further detail below, see e.g. FIG. 1A and FIG. 1B.

According to some examples, NMOS and PMOS devices may be realized using an array of fin structures or fins where the array of NMOS and PMOS devices may be arranged in a checkerboard fashion, as will be described in further detail below, see e.g. FIG. 7.

According to some examples, electrical supply potential connections, e.g. VDD (Anode) and VSS (Cathode) connections, of the proposed SCR device may be realized through lower level metallization, however, in such a way that the n-th level of metallization is always orthogonally aligned to the (n−1)-th and (n+1)-th metallization levels and hence distributing current uniformly throughout the distributed SCR array, as will be described in further detail below, see e.g. FIG. 8A and FIG. 8B.

According to some examples, an SCR device may include a gate realized using a highly resistive material, such as poly silicon or a thin metal film forming a relatively high resistive layer by its gate resistance.

According to some examples, an SCR device may be provided where a width of the NMOS device controls the current flow in the NMOS device but also controls the amount of ballast resistor for the PMOS device, and where a width of the PMOS device controls the current flow in the PMOS device but also controls the amount of ballast resistor for the NMOS device.

According to some examples, an SCR device may be provided where a width of the MOS device controls a time constant of a built-in trigger circuit (time constant formed by built-in ballast resistor and parasitic gate capacitances of the MOS device).

According to some examples, an SCR device may be provided where NMOS and PMOS devices are realized in a stacked configuration in order to increase a time constant of a built-in trigger circuit.

The aforementioned gate resistors may serve the following purposes:

i) R in the RC timer (R: resistance, C: capacitance), which triggers MOS devices and CMOS SCR action during an ESD event;

ii) R for voltage drop to bias the gate for MOS SCR action;

iii) Ballasting resistor for high current operation when multiple unit cells are connected in parallel.

According to various examples, one or more of the following design principles may be considered in an SCR device:

W/L (W: gate width, L: gate length) of the MOS transistor determines:

i) MOS current: increased W as well as reduced L lead to increased MOS current;

ii) W/L of the MOS=W/L of the gate/ballast resistor: increased W as well as reduced L lead to increased resistance (R).

Therefore, from a design view point it may be beneficial to have a low L and large W to achieve high MOS current, improved ballasting and high RC time constant.

Figure 1B:
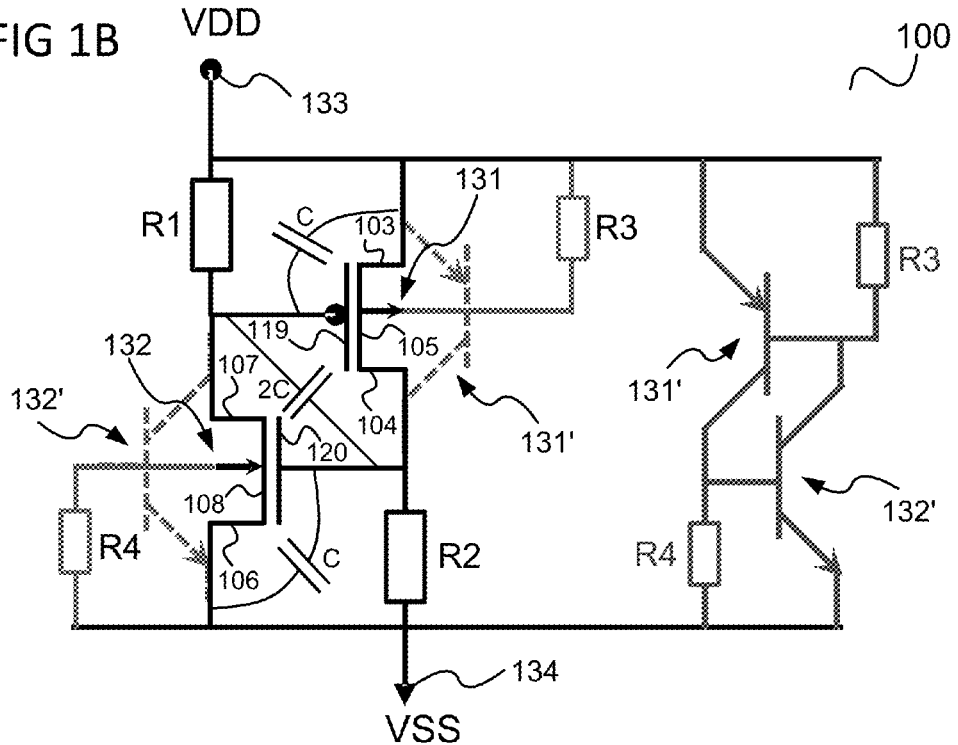

FIG. 1A shows a top view of a semiconductor device 100 according to various aspects of this disclosure, and FIG. 1B shows a circuit view of the semiconductor device 100.

The semiconductor device 100 includes a first semiconductor region 101 and a second semiconductor region 102 disposed adjacent to the first semiconductor region 101. The first semiconductor region 101 and the second semiconductor region 102 may have a common interface 151. The first semiconductor region 101 is of a first conductivity type and the second semiconductor region 102 is of a second conductivity type. For example, the first conductivity type may be an n-type conductivity type and the second conductivity type may be a p-type conductivity type. For example, the first semiconductor region 101 may be n-doped and the second semiconductor region 102 may be p-doped. The interface 151 may be a pn-interface. For example, the first and second semiconductor regions 101, 102 may have about the same dopant concentration. Alternatively, the dopant concentrations of the first and second semiconductor regions 101, 102 may be different from one another. For example, the first semiconductor region 101 may be a first well region, e.g. an n-well region, and the second semiconductor region 102 may be a second well region, e.g. a p-well region.

The semiconductor device 100 further includes a third semiconductor region 103 and a fourth semiconductor region 104 disposed over or at least partially within the first semiconductor region 101. The third and fourth semiconductor regions 103, 104 are of the second conductivity type. For example, the third and fourth semiconductor regions 103, 104 may be p-doped, for example having a higher dopant concentration than the first semiconductor region 101. The third and fourth semiconductor regions 103, 104 may have about the same dopant concentration. Alternatively, the dopant concentrations of the third and fourth semiconductor regions 103, 104 may be different from one another.

The semiconductor device 100 further includes a fifth semiconductor region 105 disposed between the third and fourth semiconductor regions 103, 104 (in FIG. 1A, the fifth semiconductor region 105 is hidden under a first gate 119). The fifth semiconductor region 105 is of the first conductivity type. For example, the fifth semiconductor region 105 may be n-doped, for example having a lower dopant concentration than the first and second semiconductor regions 101, 102.

The semiconductor device 100 further includes a first gate 119 disposed over the fifth semiconductor region 105. The first gate 119 may include or consist of an electrically conductive material, e.g. polysilicon, a metal or metal alloy, or the like. The first gate 119 may have a high resistivity, for example by using a highly resistive material such as polysilicon or a thin metal film forming a relatively high resistive layer by its gate resistance.

For example, the polysilicon or metal film may have a thickness of less than or equal to about 10 nm, e.g. in the range from about 5 nm to about 100 nm, although other thicknesses may be possible as well.

For example, the first gate 119 or the gate material of the first gate 119 may have a resistivity of greater than or equal to about 100 Ohms/square, for example in the range from about 10 Ohms/square to about 1000 Ohms/square. The first gate 119 may be insulated from the fifth semiconductor region 105 by an insulating layer or layer stack, e.g. a gate dielectric such as a gate oxide, or the like.

The semiconductor device 100 further includes a sixth semiconductor region 106 and a seventh semiconductor region 107 disposed over or at least partially within the second semiconductor region 102. The sixth and seventh semiconductor regions 106, 107 are of the first conductivity type. For example, the sixth and seventh semiconductor regions 106, 107 may be n-doped, for example having a higher dopant concentration than the second semiconductor region 102. For example, the sixth and seventh semiconductor regions 106, 107 may have about the same dopant concentration. Alternatively, the dopant concentrations of the sixth and seventh semiconductor regions 106, 107 may be different from one another. For example, the sixth and seventh semiconductor regions 106, 107 may have about the same dopant concentration as the third and fourth semiconductor regions 103, 104. Alternatively, the dopant concentrations of the sixth and seventh semiconductor regions 106, 107 may be different from the dopant concentrations of the third and fourth semiconductor regions 103, 104.

The semiconductor device 100 further includes an eighth semiconductor region 108 disposed between the sixth and seventh semiconductor regions 106, 107 (in FIG. 1A, the eight semiconductor region 108 is hidden under a second gate 120). The eighth semiconductor region 108 is of the second conductivity type. For example, the eighth semiconductor region 108 may be p-doped, for example having a lower dopant concentration than the sixth and seventh semiconductor regions 106, 107. For example, the eighth semiconductor region may 108 have about the same dopant concentration as the fifth semiconductor region 105. Alternatively, the dopant concentrations of the firth and eighth semiconductor regions 105, 108 may be different from one another.

The semiconductor device 100 further includes a second gate 120 disposed over the eighth semiconductor region 108. The second gate 120 may include or consist of an electrically conductive material, e.g. polysilicon, a metal or metal alloy, or the like. The second gate 120 may have a high resistivity, for example by using a highly resistive material such as polysilicon or a thin metal film forming a relatively high resistive layer by its gate resistance.

For example, the second gate 120 or the gate material of the second gate 120 may have a resistivity of greater than or equal to about 100 Ohms/square, for example in the range from about 10 Ohms/square to about 1000 Ohms/square. For example, the second gate 120 may include or consist of the same material as the first gate 119. The second gate 120 may be insulated from the eighth semiconductor region 108 by an insulating layer, e.g. a gate dielectric such as a gate oxide, or the like.

In an example, the semiconductor device 100 may include at least one first semiconductor fin structure (or fin) 111, e.g. a plurality of first semiconductor fin structures (or fins) 111 as shown in FIG. 1A, and at least one second semiconductor fin structure (or fin) 112, e.g. a plurality of second semiconductor fin structures (or fins) 112 as shown in FIG. 1A.

The term "fin structure" or "fin" may, e.g., include a ridge structure or a rib structure whose width and/or height may be substantially smaller than its length, e.g. at least two times smaller, e.g. at least five times smaller, e.g. at least ten times smaller, e.g. at least 50 times smaller, e.g. at least 100 times smaller. Dimensions of a fin structure or fin may, for example, be in the range from about 3 nm to about 30 nm (width), in the range from about 5 nm to about 100 nm (height), and in the range from about 30 nm to about 500 nm (length). However, one or more of the fin structure dimensions may also have a different value.

The term "fin structure" or "fin" may, e.g., include a structure where a gate may be formed (also) over one or more sidewalls of the structure. On the contrary, a planar structure may refer to a structure where a gate may be formed over (e.g. only over) a top surface or bottom surface of the structure.

As an example, FIG. 1A shows seven first fin structures 111 and seven second fin structures 112. However, the number of first fin structures 111 and/or the number of second fin structures 112 may be different from seven and may generally be any number greater than or equal to one, and may, e.g., be on the order of tens, hundreds, or even more, fins.

The first fin structures 111 may, e.g., be arranged at least substantially parallel to one another, and the second fin structures 112 may be arranged at least substantially parallel to one another, as shown. The first fin structures 111 may, e.g., be arranged at least substantially parallel to the second fin structures 112, as shown. The first fin structures 111 and/or the second fin structures 112 may, e.g., be arranged at least substantially perpendicular to the interface 151, as shown.

A semiconductor device 100 having a plurality of fin structures may also be referred to as having a multi-fin structure.

The at least one first semiconductor fin structure 111 may include the third semiconductor region 103, the fourth semiconductor region 104, and the fifth semiconductor region 105, and the at least one second semiconductor fin structure 112 may include the sixth semiconductor region 106, the seventh semiconductor region 107, and the eighth semiconductor region 108.

In case the semiconductor device 100 includes at least one or a plurality of first fin structures (or fins) 111, the first gate 119 may be disposed over (e.g. wrapped around) all of the first fin structures 111. In other words, the first gate 119 may serve as a common gate for all of the first fin structures 111.

In case the semiconductor device 100 includes at least one or a plurality of second fin structures (or fins) 112, the second gate 120 may be disposed over (e.g. wrapped around) all of the second fin structures 112. In other words, the second gate 120 may serve as a common gate for all of the second fin structures 112.

The third semiconductor region 103 is coupled to a first region 119a of the first gate 119 and the seventh semiconductor region 107 is coupled to a second region 119b of the first gate 119.

The first and second regions 119a, 119b of the first gate 119 may be end regions of the first gate 119. The first and second regions 119a, 119b of the first gate 119 may be opposite ends of the first gate 119 or may be disposed at or near opposite ends of the first gate 119. In other words, the first region 119a may be an end of the first gate 119 or may be disposed at or near an end of the first gate 119, and the second region 119b may be an opposite end of the first gate 119 or may be disposed at or near an opposite end of the first gate 119. The opposite ends of the first gate 119 may be lateral ends of the first gate 119. The opposite ends may be opposite ends in a width direction of the first gate 119. The width direction may be a direction, which is substantially perpendicular to a current flow direction in the third through fifth semiconductor regions 103-105. The width direction may be a direction, which is substantially parallel to the interface 151.

The first and second regions 119a, 119b may be spaced apart from one another by an intermediate region of the first gate 119 disposed between the first and second regions 119a, 119b of the first gate 119. A distance between the first and second regions 119a, 119b of the first gate 119 may correspond to or may be about the same as a width W of a first field effect transistor (FET) device 131 formed by the third to fifth semiconductor regions 103-105 and the first gate 119.

During operation of the semiconductor device 110, the first region 119a of the first gate 119 may be at a different electrical potential than the second region 119b of the first gate 119. During operation of the semiconductor device 110, an electrical current may flow from the first region 119a to the second region 119b of the first gate 119, or vice versa, and the first gate 119 may constitute a resistor 125 in the current path, as shown in FIG. 1A, herein also referred to as gate resistor or ballast resistor. A resistance of the resistor 125 may, for example, depend on geometric dimensions of the first gate 119 (e.g. length, width, height) and/or a material of the first gate 119.

The coupling of the third semiconductor region 103 to the first region 119a of the first gate 119 may be achieved by a first electrical connection, schematically illustrated as a line 121 in FIG. 1A. The first electrical connection 121 may, for example, include one or more interconnect structures or interconnects, and/or one or more via structures or vias, and/or one or more contact structures or contacts. The first electrical connection 121 may include or consist of an electrically conductive material such as, for example, a metal or metal alloy, or the like. A first end 121a of the first electrical connection 121 may be coupled to, e.g. in contact, e.g. direct physical contact, with, the third semiconductor region 103 and a second end 121b of the first electrical connection 121 may be coupled to, e.g. in contact, e.g. direct physical contact, with, the first region 119a of the first gate 119.

The coupling of the seventh semiconductor region 107 to the second region 119b of the first gate 119 may be achieved by a second electrical connection, schematically illustrated as a line 122 in FIG. 1A. The second electrical connection 122 may, for example, include one or more interconnect structures or interconnects, and/or one or more via structures or vias, and/or one or more contact structures or contacts. The second electrical connection 122 may include or consist of an electrically conductive material such as, for example, a metal or metal alloy, or the like. A first end 122a of the second electrical connection 122 may be coupled to, e.g. in contact, e.g. direct physical contact, with, the seventh semiconductor region 107 and a second end 122b of the second electrical connection 122 may be coupled to, e.g. in contact, e.g. direct physical contact, with, the second region 119b of the first gate 119.

The fourth semiconductor region 104 is coupled to a first region 120a of the second gate 120 and the sixth semiconductor region 106 is coupled to a second region 120b of the second gate 120.

The first and second regions 120a, 120b of the second gate 120 may be end regions of the second gate 120. The first and second regions 120a, 120b of the second gate 120 may be opposite ends of the second gate 120 or may be disposed at or near opposite ends of the second gate 120. In other words, the first region 120a may be an end of the second gate 120 or may be disposed at or near an end of the second gate 120, and the second region 120b may be an opposite end of the second gate 120 or may be disposed at or near an opposite end of the second gate 120. The opposite ends of the second gate 120 may be lateral ends of the second gate 120. The opposite ends may be opposite ends in a width direction of the second gate 120. The width direction may be a direction, which is substantially perpendicular to a current flow direction in the sixth through eighth semiconductor regions 106-108. The first and second regions 120a, 120b may be spaced apart from one another by an intermediate region of the second gate 120 disposed between the first and second regions 120a, 120b of the second gate 120. A distance between the first and second regions 120a, 120b of the second gate 120 may correspond to or may be about the same as a width W of a second field effect transistor (FET) device 132 formed by the sixth to eighth semiconductor regions 106-108 and the second gate 120.

During operation of the semiconductor device 110, the first region 120a of the second gate 120 may be at a different electrical potential than the second region 120b of the second gate 120. During operation of the semiconductor device 110, an electrical current may flow from the first region 120a to the second region 120b of the second gate 120, or vice versa, and the second gate 120 may constitute a resistor 126 in the current path, as shown in FIG. 1A, herein also referred to as gate resistor or ballast resistor. A resistance of the resistor 126 may, for example, depend on geometric dimensions of the second gate 120 (e.g. length, width, height) and/or a material of the second gate 120. The resistor 126 may, e.g., have about the same resistance as the resistor 125. Alternatively, the resistors 125 and 126 may have different resistances.

The coupling of the fourth semiconductor region 104 to the first region 120a of the second gate 120 may be achieved by a third electrical connection, schematically illustrated as a line 123 in FIG. 1A. The third electrical connection 123 may, for example, include one or more interconnect structures or interconnects, and/or one or more via structures or vias, and/or one or more contact structures or contacts. The third electrical connection 123 may include or consist of an electrically conductive material such as, for example, a metal or metal alloy, or the like. A first end 123a of the third electrical connection 123 may be coupled to, e.g. in contact, e.g. direct physical contact, with, the fourth semiconductor region 104 and a second end 123b of the third electrical connection 123 may be coupled to, e.g. in contact, e.g. direct physical contact, with, the first region 120a of the second gate 120.

The coupling of the sixth semiconductor region 106 to the second region 120b of the second gate 120 may be achieved by a fourth electrical connection, schematically illustrated as a line 124 in FIG. 1A. The fourth electrical connection 124 may, for example, include one or more interconnect structures or interconnects, and/or one or more via structures or vias, and/or one or more contact structures or contacts. The fourth electrical connection 124 may include or consist of an electrically conductive material such as, for example, a metal or metal alloy, or the like. A first end 124a of the fourth electrical connection 124 may be coupled to, e.g. in contact, e.g. direct physical contact, with, the sixth semiconductor region 106 and a second end 124b of the fourth electrical connection 124 may be coupled to, e.g. in contact, e.g. direct physical contact, with, the second region 120b of the second gate 120.

The semiconductor device 100 may further include a ninth semiconductor region 109 disposed over or at least partially within the first semiconductor region 101. The ninth semiconductor region 109 may be of the first conductivity type. For example, the ninth semiconductor region 109 may be n-doped, for example having a higher dopant concentration than the first semiconductor region 101. For example, the ninth semiconductor region 109 may have about the same dopant concentration as the third semiconductor region 103 and/or the fourth semiconductor region 104. The ninth semiconductor region 109 may, for example, serve as a contact region to the first semiconductor region 101, e.g. as a well contact region to the first well region 101.

The semiconductor device 100 may further include a tenth semiconductor region 110 disposed over or at least partially within the second semiconductor region 102. The tenth semiconductor region 110 may be of the second conductivity type. For example, the tenth semiconductor region 110 may be p-doped, for example having a higher dopant concentration than the second semiconductor region 102. For example, the tenth semiconductor region 110 may have about the same dopant concentration as the sixth semiconductor region 106 and/or the seventh semiconductor region 107. For example, the tenth semiconductor region 110 may have about the same dopant concentration as the ninth semiconductor region 109. The tenth semiconductor region 110 may, for example, serve as a contact region to the second semiconductor region, e.g. as a well contact region to the second well region 102.

Any one, e.g. all, of the first through tenth semiconductor regions 101-110 may include or consist of any suitable semiconductor material, including compound semiconductor materials, such as silicon (Si), germanium (Ge), silicon germanium (SiGe), silicon carbide (SiC), gallium arsenide (GaAs), indium phosphide (InP), indium gallium arsenide (InGaAs), or the like. In an example, the first through tenth semiconductor regions 101-110 may include or consist of silicon (Si).

Doping of any one, e.g. all, of the first through tenth semiconductor regions 101-110 may be achieved by introducing one or more suitable n-type or p-type dopant species into the respective semiconductor region or material, e.g. by means of ion implantation, thermal diffusion, or the like. Examples of n-type dopant species used for silicon n-doping may include arsenic (As), phosphorous (P), and antimony (Sb), and examples of p-type dopant species used for silicon p-doping may include boron (B) and aluminum (Al).

In an example, dopant concentrations of the first semiconductor region (e.g. first well region) 101 and/or the second semiconductor region (e.g. second well region) 102 may be in the range from about $10^{16}$ atoms/cm$^3$ to about $10^{19}$ atoms/cm$^3$, for example about $5*10^{18}$ atoms/cm$^3$, although other values may be possible as well.

In an example, dopant concentrations of at least one, e.g. all, of the third semiconductor region 103, the fourth semiconductor region 104, the sixth semiconductor region 106, the seventh semiconductor region 107, the ninth semiconductor region 109, and the tenth semiconductor region 110 may be in the range from about $10^{20}$ atoms/cm$^3$ to about $10^{22}$ atoms/cm$^3$, for example about $10^{21}$ atoms/cm$^3$, although other values may be possible as well.

In an example, dopant concentrations of the fifth semiconductor region 105 and/or the eighth semiconductor region 108 may be in the range from about $10^{14}$ atoms/cm$^3$ to about $10^{18}$ atoms/cm$^3$, for example about $10^{17}$ atoms/cm$^3$, although other values may be possible as well.

In an example, forming at least one, e.g. all, of the third semiconductor region 103, the fourth semiconductor region 104, and the ninth semiconductor region 109 may include or may be achieved by dopant implantation or dopant in-diffusion into the first semiconductor region 101. In another example, forming at least one, e.g. all, of the third semiconductor region 103, the fourth semiconductor region 104, and the ninth semiconductor region 109 may include or may be achieved by epitaxial growth over the first semiconductor region 101.

In an example, forming at least one, e.g. all, of the sixth semiconductor region 106, the seventh semiconductor region 107, and the tenth semiconductor region 110 in the second semiconductor region 102 may include or may be achieved by dopant implantation or dopant in-diffusion into the second semiconductor region 102. In another example, forming at least one, e.g. all, of the sixth semiconductor region 106, the seventh semiconductor region 107, and the tenth semiconductor region 110 may include or may be achieved by epitaxial growth over the second semiconductor region 102.

The semiconductor device 100 may be configured as a semiconductor controlled rectifier (SCR), e.g. a silicon controlled rectifier (SCR) in case the device 100 is based on silicon.

For example, the third semiconductor region 103 may be an anode region of the SCR 100, which may be coupled to a first power supply terminal 133, which may be coupled to an anode potential, e.g. an upper power supply potential, e.g. VDD, as shown, and the sixth semiconductor region 106 may be a cathode region of the SCR 100, which may be coupled to a second power supply terminal 134, which may be coupled to a cathode potential, e.g. a lower power supply potential, e.g. VSS, as shown. The fourth semiconductor region 104 and the seventh semiconductor region 107 may, for example, be diffusion regions of the SCR 100.

The semiconductor device 100 may include a first contact 141 coupled to, e.g. in contact, e.g. direct physical contact, with, the third semiconductor region (e.g. anode region) 103. The first contact 141 may also be referred to as a first diffusion contact or an anode contact. In case the semiconductor device 100 includes at least one first fin structure 111, the first contact 141 may also be referred to as a first fin contact. The first contact 141 may include or consist of an electrically conductive material such as, for example, a metal or metal alloy, or the like. In some examples, the first contact 141 may be configured as a bar contact. In some examples, the first contact 141 may be configured as a trench contact.

A first end of the first contact 141 may be coupled to the first power supply terminal 133, which may be coupled to the anode potential, e.g. the upper power supply potential, e.g. VDD, as shown, and a second end of the first contact 141 may be coupled to, e.g. in contact, e.g. direct physical contact, with, the first end 121a of the first electrical connection 121. The first contact 141 may be coupled to, e.g. in contact, e.g. direct physical contact, with, the at least one or the plurality of first fin structures (or fins) 111. The first end of the first contact 141 may be near the first region 119a of the first gate 119 and distant from the second region 119b of the first gate 119. The second end of the first contact 141 may be near the second region 119b of the first gate 119 and distant from the first region 119a of the first gate 119. The first contact 141 may exhibit an electrical resistance 141a between its first and second ends, as shown. The ninth semiconductor region (e.g. well contact region) 109 may be coupled to the first power supply terminal 133 (e.g. via a resistor 129), which may be coupled to the anode potential, e.g. the upper power supply potential, e.g. VDD. The resistor 129 may be an intrinsic well resistance and/or an external resistor.

The semiconductor device 100 may include a second contact 142 coupled to, e.g. in contact, e.g. direct physical contact, with, the sixth semiconductor region (e.g. cathode region) 106. The second contact 142 may also be referred to as a second diffusion contact or a cathode contact. In case the semiconductor device 100 includes at least one second fin structure 112, the second contact 142 may also be referred to as a second fin contact. The second contact 142 may include or consist of an electrically conductive material such as, for example, a metal or metal alloy, or the like. In some examples, the second contact 142 may be configured as a bar contact. In some examples, the second contact 142 may be configured as a trench contact.

A first end of the second contact 142 may be coupled to the second power supply terminal 134, which may be coupled to the cathode potential, e.g. the lower power supply potential, e.g. VSS, as shown, and a second end of the second contact 142 may be coupled to, e.g. in contact, e.g. direct physical contact, with, the first end 124a of the fourth electrical connection 124. The second contact 142 may be coupled to, e.g. in contact, e.g. direct physical contact, with, the at least one or the plurality of second fin structures (or fins) 112. The first end of the second contact 142 may be near the second region 120b of the second gate 120 and distant from the first region 120a of the second gate 120. The second end of the second contact 142 may be near the first region 120a of the second gate 120 and distant from the second region 120b of the second gate 120. The second contact 142 may exhibit an electrical resistance 142a between its first and second ends, as shown. The tenth semiconductor region (e.g. well contact region) 110 may be coupled to the second power supply terminal 134 (e.g. via a resistor 130), which may be coupled to the cathode potential, e.g. the lower power supply potential, e.g. VSS. The resistor 130 may be an intrinsic well resistance and/or an external resistor.

The semiconductor device 100 may include a third contact 143 coupled to, e.g. in contact, e.g. direct physical contact, with, the fourth semiconductor region (e.g. diffusion region) 104. The third contact 143 may also be referred to as a third diffusion contact. In case the semiconductor device 100 includes at least one first fin structure 111, the third contact 143 may also be referred to as a third fin contact. The third contact 143 may include or consist of an electrically conductive material such as, for example, a metal or metal alloy, or the like. In some examples, the third contact 143 may be configured as a bar contact. In some examples, the third contact 143 may be configured as a trench contact.

The third contact 143 may be coupled to, e.g. in contact, e.g. direct physical contact, with, the at least one or the plurality of first fin structures (or fins) 111. A first end of the third contact 143 may be near the first region 119a of the first gate 119 and distant from the second region 119b of the first gate 119. A second end of the third contact 143 may be near the second region 119b of the first gate 119 and distant from the first region 119a of the first gate 119. The third contact 143 may exhibit an electrical resistance 143a between its first and second ends, as shown. The second end of the third contact 143 may be coupled to the first end 123a of the third electrical connection 123.

The semiconductor device 100 may include a fourth contact 144 coupled to, e.g. in contact, e.g. direct physical contact, with, the seventh semiconductor region (e.g. diffusion region) 107. The fourth contact 144 may also be referred to as a fourth diffusion contact. In case the semiconductor device 100 includes at least one second fin structure 112, the fourth contact 144 may also be referred to as a fourth fin contact. The fourth contact 144 may include or consist of an electrically conductive material such as, for example, a metal or metal alloy, or the like. In some examples, the fourth contact 144 may be configured as a bar contact. In some examples, the fourth contact 144 may be configured as a trench contact.

The fourth contact 144 may be coupled to, e.g. in contact, e.g. direct physical contact, with, the at least one or the plurality of second fin structures (or fins) 112. A first end of the fourth contact 144 may be near the first region 120a of the second gate 120 and distant from the second region 120b of the second gate 120. A second end of the fourth contact 144 may be near the second region 120b of the second gate 120 and distant from the first region 120a of the second gate 120. The fourth contact 144 may exhibit an electrical resistance 144a between its first and second ends, as shown. The second end of the fourth contact 144 may be coupled to the first end 122a of the second electrical connection 122.

The third through fifth semiconductor regions 103-105 and the first gate 119 may be considered as parts of a first field effect transistor (FET) device 131, e.g. a first FinFET device in case the semiconductor device 100 includes at least one or a plurality of first fin structures (or fins) 111, and the sixth through eighth semiconductor regions 106-108 and the second gate 120 may be considered as parts of a second field effect transistor (FET) device 132, e.g. a second FinFET device in case the semiconductor device 100 includes at least one or a plurality of second fin structures (or fins) 112, as shown in FIG. 1B.

In particular, the third and fourth semiconductor regions 103, 104 may be considered as source/drain regions, the fifth semiconductor region 105 may be considered as body or channel region, and the first gate 119 may be considered as gate of the first FET 131, while the sixth and seventh semiconductor regions 106, 107 may be considered as source/drain regions, the eighth semiconductor region 108 may be considered as body or channel region, and the second gate 120 may be considered as gate of the second FET 132.

The first FET 131 may be configured as a p-type FET (PFET), e.g. a PMOS, e.g. a PMOS FinFET, and the second FET 132 may be configured as an n-type FET (NFET), e.g. an NMOS, e.g. an NMOS FinFET, as shown in FIG. 1B.

FIG. 1B shows a circuit view of the semiconductor device 100. FIG. 1B shows that the semiconductor device 100 may include p-type (e.g. PMOS) and n-type (e.g. NMOS) devices 131, 132 connected in a cross-coupled fashion such that they form an SCR (e.g. CMOS SCR). Additionally, an inherent parasitic bipolar SCR may be also present, which may include a parasitic PNP bipolar device 131' and a parasitic NPN bipolar device 132', which are shown in dashed lines on the left side of the circuit view, and are additionally shown on the right side of the circuit view for enhanced clarity.

The resistors R1 and R2 shown in FIG. 1B may represent resistances of the first and second gates 119, 120 and of the first and second contacts (e.g. bar contacts, e.g. trench contacts) 141, 142 shown in FIG. 1A. In particular, R1 may include or be the resistance 141a of the first contact 141 plus the resistance 125 of the first gate 119, and R2 may include or be the resistance 142a of the second contact 142 plus the resistance 126 of the second gate 120. The resistances R1 and R2 may have about the same value, or they may have different values.

The resistor R3 shown in FIG. 1B may include or be the resistor (e.g. intrinsic well resistance or external resistor) 129 shown in FIG. 1A, and the resistor R4 may include or be the resistor (e.g. intrinsic well resistance or external resistor) 130 shown in FIG. 1A. The resistances R3 and R4 may have about the same value, or they may have different values.

The capacitances C shown in FIG. 1B may be given by $C \approx 0.5 \, (C_{para} + C_{ox})$, where $C_{para}$ may be a gate-drain/gate-source overlap capacitance and $C_{ox}$ may be a gate dielectric (e.g. gate oxide) capacitance of the p-type (e.g. PMOS) and n-type (e.g. NMOS) devices 131, 132. A time constant of the circuit shown in FIG. 1B may be 5/3*R*C, where R=R1 or R2.

The semiconductor device 100, e.g. SCR (e.g. CMOS SCR), shown in FIG. 1A and FIG. 1B may be used as an ESD protection device, for example to protect one or more devices, e.g. functional devices, e.g. circuit devices, e.g. integrated circuit (IC) devices, against electrostatic discharges. For example, the semiconductor device 100 may be electrically coupled (e.g. in parallel) to the one or more devices to be protected.

The semiconductor device 100 includes gate resistors 125 and 126, which may serve the following purposes:

i) R in the RC timer (R: resistance, C: capacitance), which triggers FET (e.g. MOS) devices and SCR (e.g. CMOS SCR) action during an ESD event;

ii) R for voltage drop to bias the gate for FET (e.g. MOS) SCR action;

iii) Ballasting resistor for high current operation when multiple unit cells are connected in parallel, as mentioned herein above.

According to various examples, one or more of the following design principles may be considered in the semiconductor device (e.g. SCR device) 100:

W/L (W: gate width, L: gate length) of the FET (e.g. MOS) transistors 131, 132 determines:

i) FET (e.g. MOS) current: increased W as well as reduced L lead to increased FET (e.g. MOS) current;

ii) W/L of the FET (e.g. MOS) 131, 132=W/L of the gate/ballast resistor 125, 126: increased W as well as reduced L lead to increased resistance (R).

Therefore, from a design view point it may be beneficial to have a low L and large W to achieve high FET (e.g. MOS) current, improved ballasting and high RC time constant, as mentioned herein above.

It is noted that in case the semiconductor device 100 includes a plurality of first and second fin structures 111, 112, the resistances 141a-144a of the first to fourth diffusion/fin contacts 141-144 may also be used for current ballasting and biasing purpose in such a way that fins, which receive higher gate bias, may also see higher ballast resistance, and vice versa.

In the semiconductor device 100 of FIG. 1A, the third semiconductor region 103 (e.g. anode region) and the sixth semiconductor region 106 (e.g. cathode region) are disposed at or near opposite ends of the semiconductor device 100. More particularly, the fifth semiconductor region 105, the fourth semiconductor region 104, a portion of the first semiconductor region 101, a portion of the second semiconductor region 102, the seventh semiconductor region 107 and the eighth semiconductor region 108 are disposed between the third semiconductor region 103 and the sixth semiconductor region 106, as shown in FIG. 1A.

FIG. 2 shows a top view of a semiconductor device 200, where the third semiconductor region 103 (e.g. anode region) and the sixth semiconductor region 106 are disposed closer to one another compared to the semiconductor device 100. Reference signs that are the same as in FIG. 1A and FIG. 1B denote the same or similar elements as there and will not be described in detail again here. Reference is made to the description above.

In the semiconductor device 200, the third to eighth semiconductor regions 103-108 are disposed such that a spacing 250 between the third semiconductor region 103 (e.g. anode region) and the sixth semiconductor region 106 is reduced compared to the semiconductor device 100. In particular, in the semiconductor device 200, the fourth semiconductor region 104 and the seventh semiconductor region 107 may be disposed at or near opposite ends of the semiconductor device 200. Thus, a portion of the first semiconductor region 101 and a portion of the second semiconductor region 102 may still be disposed between the third semiconductor region 103 (e.g. anode region) and the sixth semiconductor region 106 (e.g. cathode region), whereas the fourth semiconductor region 104, the fifth semiconductor region 105, the seventh semiconductor region 107 and the eighth semiconductor region 108 are no longer disposed between the third semiconductor region 103 and the fourth semiconductor region 104.

In other words, in the semiconductor device 200 the third semiconductor region 103 (anode region) may be disposed closer to the interface 151 between the first semiconductor region 101 and the semiconductor region 102 than the fourth semiconductor region 104 (diffusion region), and the sixth semiconductor region 106 (cathode region) may be disposed closer to the interface 151 than the seventh semiconductor region 107 (diffusion region).

Semiconductor device 200 may be used as a SCR device with improved bipolar SCR performance. The MOS SCR and related current ballasting may remain the same as in the semiconductor device 100. However, the connections are illustratively configured in such a way that the bipolar SCR may have a reduced (e.g. minimum) anode-to-cathode spacing 250. The bipolar SCR may be formed by the third semiconductor region 103 (anode region), the portion of the first semiconductor region 101, the portion of the second semiconductor region 102, and the sixth semiconductor region 106 (cathode region).

It is noted that a circuit view corresponding to the semiconductor device 200 may be similar to the circuit view of the semiconductor device 100 as shown in FIG. 1B and is thus not shown again here.

In the semiconductor devices 100 and 200, a tapping point for a gate bias voltage for the first gate 119 may be at the second end of the first contact 141 (coupled to the first end 121a of the first electrical connection 121, as shown), and a tapping point for a gate bias voltage for the second gate 120 may be at the second end of the second contact 142 (coupled to the first end 124a of the fourth electrical connection 124, as shown). Thus, the resistance 141a of the first contact 141 may form between the first power supply terminal 133 and the gate bias voltage tapping point for the first gate 119, and the resistance 142a of the second contact 142 may form between the second power supply terminal 134 and the gate bias voltage tapping point for the second gate 120.

Also, in the semiconductor devices 100 and 200, current feeding points may be at the first ends of the first and second contacts 141, 142, i.e. at the ends coupled to the power supply terminals 133, 134, at the second end of the third contact 143, i.e. at that end of the third contact 143 that is closer to the second region 119b of the first gate 119, and at the first end of the fourth contact 144, i.e. at that end of the fourth contact 144 that is closer to the first region 120a of the second gate 120, as shown.

More particularly, it may be beneficial to feed the current into and sink the current from the multi-fin structures in a diagonally symmetrical way. For example, as shown in FIG. 1A and FIG. 2, for the first FET (e.g. PFET, e.g. PMOS) device 131, the current may be fed from VDD while starting the feeding from the first end of the first contact 141 into the multi-fin structure (i.e. from that end of the first contact 141 that is closer to the first region 119a of the first gate 119), and the current may be sunk towards the second FET (e.g. NFET, e.g. NMOS) device 132 while starting the sinking from the second end of the third contact 143 from the multi-fin structure (i.e. from that end of the third contact 143 that is closer to the second region 119b of the first gate. Similarly, for the second FET (e.g. NFET, e.g. NMOS) device 132, the current may be fed from the first electrical connection 122 while starting the feeding from the first end of the fourth contact 144 into the multi-fin structure (i.e. from that end of the fourth contact 144 that is closer to the first region 120a of the second gate 120), and the current may be sunk towards VSS while starting the sinking from the first end of the second contact 142 from the multi-fin structure (i.e. from that end of the second contact 142 that is closer to the second region 120b of the second gate 120).

Illustratively, current feeding points in the semiconductor devices 100 and 200 may be diagonal symmetrical to the respective FET (e.g. MOS) device 131, 132, and the gate bias voltage tapping points and current feeding points may be opposite to each other on the same side of the drain side in each device.

Semiconductor devices according to various aspects of this disclosure may be implemented in FinFET technology, as shown e.g. in FIG. 1A and FIG. 2, and may be used as FinFET SCR devices e.g. for ESD protection. However, semiconductor devices according to various aspects of this disclosure may also be implemented in planar technology. An example of a semicoductor device implemented in planar technology is shown in FIG. 3A and FIG. 3B.

FIG. 3A shows a top view of a semiconductor device 300 in planar technology according to various aspects of this disclosure, and FIG. 3B shows a circuit view of the semiconductor device 300.

Reference signs that are the same as in the previous figures denote the same or similar elements as there and will not be described in detail again here. Reference is made to the description above.

In the semiconductor device 300, each of the third through eighth semiconductor regions 103-108 may be configured as a single contiguous semiconductor region.

The first contact 141 may be coupled to, e.g. in contact, e.g. direct physical contact with, the third semiconductor region 103. The first contact 141 may include one or more contact holes 360 that may be coupled to, e.g. in contact, e.g. direct physical contact with, the third semiconductor region 103.

The first end 121a of the first electrical connection 121 may be coupled to, e.g. in contact, e.g. direct physical contact, with, the first contact 141. In an example, the first end 121a of the first electrical connection 121 may be coupled to, e.g. in contact, e.g. direct physical contact, with, a center portion of the first contact 141, as shown. Alternatively, the first end 121a of the first electrical connection 121 may be coupled to, e.g. in contact, e.g. direct physical contact, with any other portion of the first contact 141.

The second contact 142 may be coupled to, e.g. in contact, e.g. direct physical contact with, the sixth semiconductor region 106. The second contact 142 may include one or more contact holes 360 that may be coupled to, e.g. in contact, e.g. direct physical contact with, the sixth semiconductor region 106. The first end 124a of the fourth electrical connection 124 may be coupled to, e.g. in contact, e.g. direct physical contact, with, the second contact 142. In an example, the first end 124a of the fourth electrical connection 124 may be coupled to, e.g. in contact, e.g. direct physical contact, with, a center portion of the second contact 142, as shown. Alternatively, the first end 124a of the fourth electrical connection 124 may be coupled to, e.g. in contact, e.g. direct physical contact, with any other portion of the second contact 142.

The third contact 143 may be coupled to, e.g. in contact, e.g. direct physical contact with, the fourth semiconductor region 104. The third contact 143 may include one or more contact holes 360 that may be coupled to, e.g. in contact, e.g. direct physical contact with, the fourth semiconductor region 104. The first end 123a of the third electrical connection 123 may be coupled to, e.g. in contact, e.g. direct physical contact, with, the third contact 143. In an example, the first end 123a of the third electrical connection 123 may be coupled to, e.g. in contact, e.g. direct physical contact, with, a center portion of the third contact 143, as shown. Alternatively, the first end 123a of the third electrical connection 123 may be coupled to, e.g. in contact, e.g. direct physical contact, with any other portion of the third contact 143.

The fourth contact 144 may be coupled to, e.g. in contact, e.g. direct physical contact with, the seventh semiconductor region 107. The fourth contact 144 may include one or more contact holes 360 that may be coupled to, e.g. in contact, e.g. direct physical contact with, the seventh semiconductor region 107. The first end 122a of the second electrical connection 122 may be coupled to, e.g. in contact, e.g. direct physical contact, with, the fourth contact 144. In an example, the first end 122a of the second electrical connection 122 may be coupled to, e.g. in contact, e.g. direct physical contact, with, a center portion of the fourth contact 144, as shown. Alternatively, the first end 122a of the second electrical connection 122 may be coupled to, e.g. in contact, e.g. direct physical contact, with any other portion of the fourth contact 144.

FIG. 3B shows a circuit view of the semiconductor device 300. Similarly as in FIG. 1B, FIG. 3B shows the p-type (e.g. PMOS) and n-type (e.g. NMOS) devices 131, 132 and the parasitic bipolar devices 131', 132' that may occur in the semiconductor device 300. The resistors R1 and R2 may represent resistances of the gate resistors 125 and 126 of FIG. 3A, respectively. The resistors R1 and R2 may have about the same value, or they may have different values.

Similarly to the FinFET devices described above, planar semiconductor device 300 may be used as SCR device e.g. for ESD protection. For example, semiconductor device 300 may be electrically coupled (e.g. in parallel) to one or more devices, e.g. functional devices, to be protected against ESD.

Semiconductor devices described herein may serve as SCR clamp devices, or short, clamps, which may be configured to clamp a voltage in case of an ESD surge.

Figure 4:
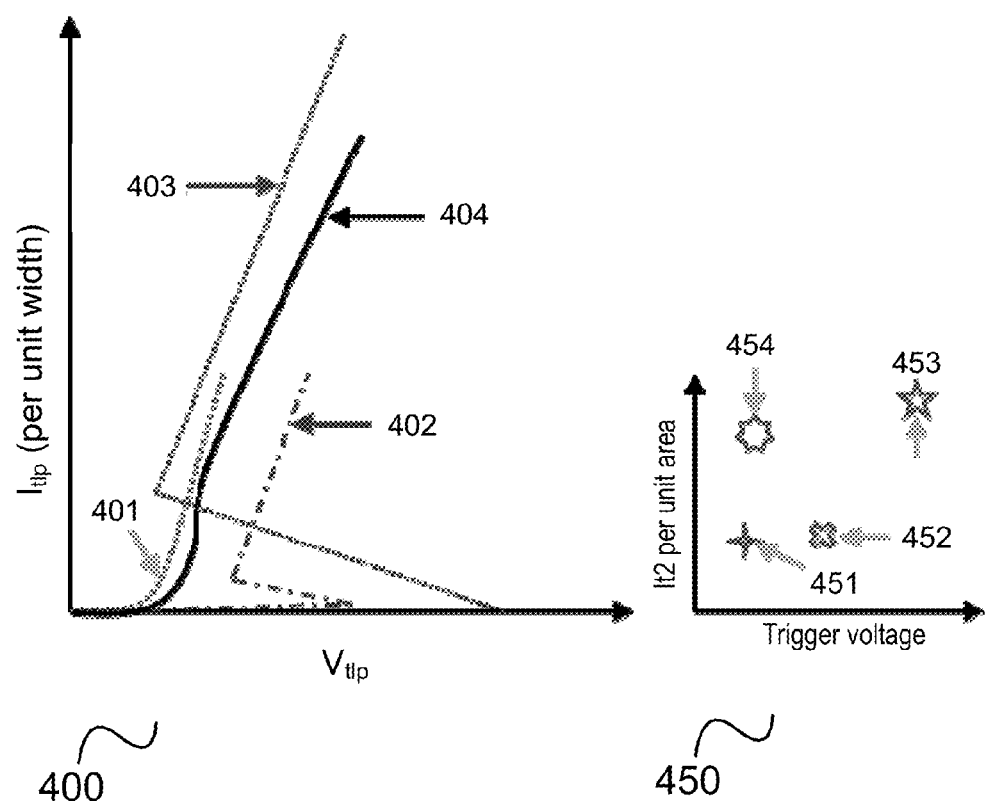
FIG. 4 shows operating characteristics of semiconductor devices according to various aspects of this disclosure.

FIG. 4 shows, in a first diagram 400, expected I-V (current-voltage) characteristics of SCR clamp devices according to aspects of this disclosure, and, in a second diagram 450, It2 (failure current) values per unit area versus trigger voltage of various intended and parasitic components in the SCR clamp devices.

In the first diagram 400, curve 401 represents an I-V characteristics of an RC-MOS component, curve 402 represents an I-V characteristics of a MOS SCR component, and curve 403 represents an I-V characteristics of a BJT SCR component of an SCR clamp device, and curve 404 represents the effective clamp behavior of the SCR clamp device.

In the second diagram 450, point 451 represents an It2 value of the RC-MOS component, point 452 represents an It2 value of the MOS SCR component, and point 453 represents an It2 value of the BJT SCR component of the SCR clamp device, and point 454 represents an It2 value of the SCR clamp device.

In the semiconductor devices 100, 200 and 300 described herein above, gate resistors 125 and 126 of the gates 119, 120 of the p-type (e.g. PMOS) and n-type (e.g. NMOS) FET devices 131, 132 serve as resistances for current ballasting and intrinsic trigger circuits. According to an aspect of this disclosure, the resistance of the ballasting and the intrinsic trigger circuit may be increased by utilizing one or more additional gates, also referred to as dummy gates herein, as shown in FIG. 5A and FIG. 5B.

FIG. 5A shows a top view of a semiconductor device 500 including additional (dummy) gates according to various aspects of this disclosure, and FIG. 5B shows a circuit view of the semiconductor device 500.

Reference signs that are the same as in the previous figures denote the same or similar elements as there and will not be described in detail again here. Reference is made to the description above.

The semiconductor device 500 differs from the semiconductor device 100 in that additional (dummy) gates 519', 519", 520', 520" are provided.

The dummy gates 519', 519", 520', 520" may be configured in a similar manner as the first and second gates 119, 120. For example, the dummy gates 519', 519", 520', 520" may include or consist of the same material or materials as the first and second gates 119, 120 and/or may have about the same geometric dimensions (e.g. length, width, height) as the first and second gates 119, 120. However, the dummy gates 519', 519", 520', 520" may also include or consist of different materials than the first and second gates 119, 120 and/or may have different geometric dimensions than the first and second gates 119, 120.

The term "dummy gate" may indicate that the respective gate may not be used or required for controlling a FET (e.g. MOS) current of one of the FET (e.g. MOS) devices 131, 132. Instead, the respective "dummy gate" may be used, e.g., for providing a ballasting resistance (e.g. in addition to the ballasting resistances 125, 126 provided by the first and second gates 119, 120). On the other hand, the first and second gates 119, 120 that are used (also) for controlling FET (e.g. MOS) currents of the FET (e.g. MOS) devices 132, 132 may also be referred to as "active gates".

Four dummy gates 519', 519", 520', 520" are shown as an example in FIG. 5A, with two dummy gates 519', 519" assigned to the first FET (e.g. PMOS) device 131 and two dummy gates 520', 520" assigned to the second FET (e.g. NMOS) device 132. However, the number of dummy gates may be different from four and may, in principle, be any number greater than or equal to one. In an example, the number of dummy gates may be even, i.e. two, four (as shown), six, eight, etc. In an example, the number of dummy gates assigned to the first FET device 131 may be the same as the number of dummy gates assigned to the second FET device 132, as shown. In an example, the number of dummy gates assigned to a respective FET device may be a multiple of two, i.e. two (as shown), four, six, eight, etc.

In an example, the dummy gates assigned to a respective FET device 131, 132 may be disposed at opposite sides of the corresponding gate 119, 120 of that FET device 131, 132, e.g. symmetrically with respect to the gate 119, 120, as shown. In other words, the gate 119, 120 of the respective FET device 131, 132 may be disposed between the dummy gates. For example, the first gate 119 of the first FET device 131 may be disposed between two dummy gates 519' and 519" assigned to the first FET device 131, and the second gate 120 of the second FET device 132 may be disposed between two dummy gates 520' and 520" assigned to the second FET device 132, as shown.

In particular, according to the example shown, a first dummy gate 519' assigned to the first FET device 131 may be disposed at least partially over the at least one or the plurality of first fin structures 111 with the first contact 141 being disposed between the first dummy gate 519' and the first gate 119, a second dummy gate 519" assigned to the first FET device 131 may be disposed at least partially over the at least one or the plurality of first fin structures 111 with the third contact 143 being disposed between the second dummy gate 519" and the second gate 120, a third dummy gate 520' assigned to the second FET device 132 may be disposed at least partially over the at least one or the plurality of second fin structures 112 with the second contact 142 being disposed between the third dummy gate 520' and the second gate 120, and a fourth dummy gate 520" assigned to the second FET device 132 may be disposed at least partially over the at least one or the plurality of fin structures 112 with the fourth contact 144 being disposed between the fourth dummy gate 520" and the second gate 120.

The third semiconductor region 103 may be coupled to the first region 119a of the first gate 119 via the first dummy gate 519' and the second dummy gate 519", which may provide additional ballasting resistances 525' and 525", respectively, as shown.

For example, the coupling of the third semiconductor region 103 to the first region 119a of the first gate 119 may include the first electrical connection 121 coupling the third semiconductor region 103 to a first region 519a' of the first dummy gate 519', a fifth electrical connection 535 coupling the first region 119a of the gate 119 to a first region 519a" of the second dummy gate 519", and a sixth electrical connection 536 coupling a second region 519b' of the first dummy gate 519' to a second region 519b" of the second dummy gate 519".

According to the example shown, the first end 121a of the first electrical connection 121 may be coupled to, e.g. in contact, e.g. direct physical contact, with, a center portion of the first contact 141.

The fifth electrical connection 535 may, for example, include one or more interconnect structures or interconnects, and/or one or more via structures or vias, and/or one or more contact structures or contacts. The fifth electrical connection 535 may include or consist of an electrically conductive material such as, for example, a metal or metal alloy, or the like. A first end of the fifth electrical connection 535 may be coupled to, e.g. in contact, e.g. direct physical contact, with, the first region 119a of the first gate 119 and a second end of the fifth electrical connection 535 may be coupled to, e.g. in contact, e.g. direct physical contact, with, the first region 519a" of the second dummy gate 519".

The first and second regions 519a', 519b' of the first dummy gate 519' may be end regions of the first dummy gate 519'. The first and second regions 519a', 519b' of the first dummy gate 519' may be opposite ends of the first dummy gate 519' or may be disposed at or near opposite ends of the first dummy gate 519'. In other words, the first region 519a' may be an end of the first dummy gate 519' or may be disposed at or near an end of the first dummy gate 519', and the second region 519b' may be an opposite end of the first dummy gate 519' or may be disposed at or near an opposite end of the first dummy gate 519'. The opposite ends of the first dummy gate 519' may be lateral ends of the first dummy gate 519'. The opposite ends may be opposite ends in a width direction of the first dummy gate 519'. The width direction may be a direction, which is substantially perpendicular to a current flow direction in the third through fifth semiconductor regions 103-105. The width direction may be a direction, which is substantially perpendicular to lateral sidewalls of the first fin structures 111. The first and second regions 519a', 519b' may be spaced apart from one another by an intermediate region of the first dummy gate 519' disposed between the first and second regions 519a', 519b' of the first dummy gate 519'. A distance between the first and second regions 519a', 519b' of the first dummy gate 519' may correspond to or may be about the same as the width W of the first field effect transistor (FET) device 131.

The sixth electrical connection 536 may, for example, include one or more interconnect structures or interconnects, and/or one or more via structures or vias, and/or one or more contact structures or contacts. The sixth electrical connection 536 may include or consist of an electrically conductive material such as, for example, a metal or metal alloy, or the like. A first end of the sixth electrical connection 536 may be coupled to, e.g. in contact, e.g. direct physical contact, with, the second region 519b' of the first dummy gate 519' and a second end of the sixth electrical connection 536 may be coupled to, e.g. in contact, e.g. direct physical contact, with, the second region 519b" of the second dummy gate 519".

The first and second regions 519a", 519b" of the second dummy gate 519" may be end regions of the second dummy gate 519". The first and second regions 519a", 519b" of the second dummy gate 519" may be opposite ends of the second dummy gate 519" or may be disposed at or near opposite ends of the second dummy gate 519". In other words, the first region 519a" may be an end of the second dummy gate 519" or may be disposed at or near an end of the second dummy gate 519", and the second region 519b" may be an opposite end of the second dummy gate 519" or may be disposed at or near an opposite end of the second dummy gate 519". The opposite ends of the second dummy gate 519" may be lateral ends of the second dummy gate 519". The opposite ends may be opposite ends in a width direction of the second dummy gate 519". The width direction may be a direction, which is substantially perpendicular to a current flow direction in the third through fifth semiconductor regions 103-105. The width direction may be a direction, which is substantially perpendicular to lateral sidewalls of the first fin structures 111. The first and second regions 519a", 519b" may be spaced apart from one another by an intermediate region of the second dummy gate 519" disposed between the first and second regions 519a", 519b" of the second dummy gate 519". A distance between the first and second regions 519a", 519b" of the second dummy gate 519" may correspond to or may be about the same as the width W of the first field effect transistor (FET) device 131.

Similarly as in FIG. 1A, the seventh semiconductor region 107 may be coupled to the second region 119b of the first gate 119 via the second electrical connection 122. According to the example shown, the first end 122a of the second electrical connection 122 may be coupled to, e.g. in contact, e.g. direct physical contact, with, a center portion of the fourth contact 144.

Similarly as in FIG. 1A, the fourth semiconductor region 104 may be coupled to the first region 119a of the second gate 120 via the third electrical connection 123. According to the example shown, the first end 123a of the third electrical connection 123 may be coupled to, e.g. in contact, e.g. direct physical contact, with, a center portion of the third contact 143.

The sixth semiconductor region 106 may be coupled to the second region 120b of the second gate 120 via the third dummy gate 520' and the fourth dummy gate 520", which may provide additional ballasting resistances 526' and 526", respectively, as shown.

For example, the coupling of the sixth semiconductor region 106 to the second region 120b of the second gate 120 may include a seventh electrical connection 537 coupling a first region 520a' of the third dummy gate 520' to a first region 520a" of the fourth dummy gate 520", an eighth electrical connection 538 coupling a second region 520b" of the fourth dummy gate 520" to the second region 120b of the second gate 120, and the fourth electrical connection 124 coupling the sixth semiconductor region 106 to the second region 520b' of the third dummy gate 520'.

According to the example shown, the first end 124a of the fourth electrical connection 124 may be coupled to, e.g. in contact, e.g. direct physical contact, with, a center portion of the second contact 142.

The seventh electrical connection 537 may, for example, include one or more interconnect structures or interconnects, and/or one or more via structures or vias, and/or one or more contact structures or contacts. The seventh electrical connection 537 may include or consist of an electrically conductive material such as, for example, a metal or metal alloy, or the like. A first end of the seventh electrical connection 537 may be coupled to, e.g. in contact, e.g. direct physical contact, with, the first region 520a' of the third dummy gate 520' and a second end of the seventh electrical connection 537 may be coupled to, e.g. in contact, e.g. direct physical contact, with, the first region 520a" of the fourth dummy gate 520".

The first and second regions 520a', 520b' of the third dummy gate 520' may be end regions of the third dummy gate 520'. The first and second regions 520a', 520b' of the third dummy gate 520' may be opposite ends of the third dummy gate 520' or may be disposed at or near opposite ends of the third dummy gate 520'. In other words, the first region 520a' may be an end of the third dummy gate 520' or may be disposed at or near an end of the third dummy gate 520', and the second region 520b' may be an opposite end of the third dummy gate 520' or may be disposed at or near an opposite end of the third dummy gate 520'. The opposite ends of the third dummy gate 520' may be lateral ends of the third dummy gate 520'. The opposite ends may be opposite ends in a width direction of the third dummy gate 520'. The width direction may be a direction, which is substantially perpendicular to a current flow direction in the sixth through eighth semiconductor regions 106-108. The width direction may be a direction, which is substantially perpendicular to lateral sidewalls of the second fin structures 112. The first and second regions 520a', 520b' may be spaced apart from one another by an intermediate region of the third dummy gate 520' disposed between the first and second regions 520a', 520b' of the third dummy gate 520'. A distance between the first and second regions 520a', 520b' of the third dummy gate 520' may correspond to or may be about the same as the width W of the second first field effect transistor (FET) device 132.

The eighth electrical connection 538 may, for example, include one or more interconnect structures or interconnects, and/or one or more via structures or vias, and/or one or more contact structures or contacts. The eighth electrical connection 538 may include or consist of an electrically conductive material such as, for example, a metal or metal alloy, or the like. A first end of the eighth electrical connection 538 may be coupled to, e.g. in contact, e.g. direct physical contact, with, the second region 520b" of the fourth dummy gate 520" and a second end of the eighth electrical connection 538 may be coupled to, e.g. in contact, e.g. direct physical contact, with, the second region 120b of the second gate 120.

The first and second regions 520a", 520b" of the fourth dummy gate 520" may be end regions of the fourth dummy gate 520". The first and second regions 520a", 520b" of the fourth dummy gate 520" may be opposite ends of the fourth dummy gate 520" or may be disposed at or near opposite ends of the fourth dummy gate 520". In other words, the first region 520a" may be an end of the fourth dummy gate 520" or may be disposed at or near an end of the fourth dummy gate 520", and the second region 520b" may be an opposite end of the fourth dummy gate 520" or may be disposed at or near an opposite end of the fourth dummy gate 520". The opposite ends of the fourth dummy gate 520" may be lateral ends of the fourth dummy gate 520". The opposite ends may be opposite ends in a width direction of the fourth dummy gate 520". The width direction may be a direction, which is substantially perpendicular to a current flow direction in the sixth through eighth semiconductor regions 106-108. The width direction may be a direction, which is substantially perpendicular to lateral sidewalls of the second fin structures 112. The first and second regions 520a", 520b" may be spaced apart from one another by an intermediate region of the fourth dummy gate 520" disposed between the first and second regions 520a", 520b" of the fourth dummy gate 520". A distance between the first and second regions 520a", 520b" of the fourth dummy gate 520" may correspond to or may be about the same as the width W of the second field effect transistor (FET) device 132.

Illustratively, semiconductor device 500 shown in FIG. 5A is an example of a semiconductor device where an anode region (third semiconductor region 103) of the semiconductor device may be coupled to one end of a first active gate (first gate 119) of the semiconductor device via one or a plurality of dummy gates, e.g. first and second dummy gates 519', 519" shown in FIG. 5A, and where a cathode region (sixth semiconductor region 106) of the semiconductor device may be coupled to one end of a second active gate (second gate 120) of the semiconductor device via one or a plurality of dummy gates, e.g. third and fourth dummy gates 520', 520" shown in FIG. 5A, and where the first and second active gates (first and second gates 119, 120) as well as the dummy gates (dummy gates 519', 519", 520', 520") are used for providing ballasting resistance.

Illustratively, in the semiconductor device 500, an electrically conductive path leads from the third semiconductor region (anode region) 103 via the first dummy gate 519', the second dummy gate 519", and the first active gate 119, to the seventh semiconductor region (diffusion region) 107 and includes ballasting resistances 525', 525", and 125 coupled in series, and another electrically conductive path leads from the sixth semiconductor region (cathode region) 106 via the third dummy gate 520', the fourth dummy gate 520" and the second active gate 120 to the fourth semiconductor region (diffusion region) 104 and includes ballasting resistances 526', 526", and 126 coupled in series.

The term "electrically conductive path" may be understood to refer to a path, through which an electrical current may flow.

FIG. 5B shows a circuit view of the semiconductor device 500. Similarly as in FIG. 1B and FIG. 3B, FIG. 5B shows the p-type (e.g. PMOS) and n-type (e.g. NMOS) devices 131, 132 and the parasitic bipolar devices 131', 132' that may occur in the semiconductor device 500.

The resistors R1 and R2 shown in FIG. 5B may represent resistances of the first and second gates 119, 120 and of their assigned dummy gates, i.e. first and second dummy gates 519', 519" for the first gate 119 and third and fourth dummy gates 520', 520" for the second gate 120 shown in FIG. 5A. In particular, R1 may include or be the resistance 125 of the first gate 119 plus the resistance 525' of the first dummy gate 519' and the resistance 525" of the second dummy gate 519", and R2 may include or be the resistance 126 of the second gate 120 plus the resistance 526' of the third dummy gate 520' and the resistance 526" of the fourth dummy gate 520".

The resistances 125, 525' and 525" of the first gate 119 and the first and second dummy gates 519', 519" may have about the same value, or at least one of the resistances 125, 525' and 525" may have a different value.

The resistances 126, 526' and 526" of the second gate 120 and the third and fourth dummy gates 520', 520" may have about the same value, or at least one of the resistances 126, 526' and 526" may have a different value.

The resistances R1 and R2 in FIG. 5B may have about the same value, or they may have different values.

It is noted that the drain (of NMOS and PMOS devices) connection to the gate resistor may be implemented in such a way that the gate resistor of the NMOS (PMOS) is connected close to the drain of the PMOS (NMOS). This may allow for maximum voltage drop across active gates of the CMOS SCR.

The dummy gates 519', 519", 520', 520" may be insulated from underlying layers or structures (e.g. the fin structures 111, 112) by means of a respective insulating layer or layer stack, e.g. a gate dielectric such as a gate oxide, or the like.

In the semiconductor device 500 described herein above, gate resistors 125 and 126 of the gates 119, 120 of the p-type (e.g. PMOS) and n-type (e.g. NMOS) FET devices 131, 132 as well as resistances 525', 525", 526', 526" may serve as resistances for current ballasting and intrinsic trigger circuits. According to an aspect of this disclosure, semiconductor devices may be provided where the resistance of the ballasting and the intrinsic trigger circuit may be achieved solely by dummy gates, as shown in FIG. 6A and FIG. 6B.

FIG. 6A shows a top view of a semiconductor device 600 including additional (dummy) gates according to various aspects of this disclosure, and FIG. 6B shows a circuit view of the semiconductor device 600. Semiconductor device 600 is to some degree similar to semiconductor device 500. In particular, reference signs that are the same as in FIG. 5A and FIG. 5B denote the same or similar elements as there and will not be described in detail again here. Reference is made to the description above.

Semiconductor device 600 differs from semiconductor device 500 in that the second end 122b of the second electrical connection 122, instead of being coupled to the second region 119b of the first gate 119, is coupled to, e.g. in contact, e.g. direct physical contact, with, the first region 519a" of the second dummy gate 519", and that the second end 123b of the third electrical connection 123, instead of being coupled to the first region 120a of the second gate, is coupled to, e.g. in contact, e.g. direct physical contact, with, the second region 520b" of the fourth dummy gate 520", as shown.

With the implementation shown in FIG. 6A, a ballasting path may lead only via the dummy gates 519', 519", 520', 520" but not via the active gates 119, 120. In other words, the gate resistors 125, 126 of the active gates 119, 120 are not used for ballasting purposes in the device 600. An effect resulting therefrom may be that a dependence of the total ballast resistance and/or the gate bias voltage on the gate geometry may be reduced or avoided.

Illustratively, semiconductor device 600 shown in FIG. 6A is an example of a semiconductor device where an anode region (third semiconductor region 103) of the semiconductor device may be coupled to one end of a first active gate (first gate 119) of the semiconductor device via one or a plurality of dummy gates, e.g. first and second dummy gates 519', 519" shown in FIG. 6A, and where a cathode region (sixth semiconductor region 106) of the semiconductor device may be coupled to one end of a second active gate (second gate 120) of the semiconductor device via one or a plurality of dummy gates, e.g. third and fourth dummy gates 520', 520" shown in FIG. 6A, and where the first and second active gates (first and second gates 119, 120) are not used for providing ballasting resistance.

Illustratively, in the semiconductor device 600, an electrically conductive path leads from the third semiconductor region (anode region) 103 via the first dummy gate 519' and the second dummy gate 519" to the seventh semiconductor region (diffusion region) 107 and includes ballasting resistances 525' and 525" coupled in series, and another electrically conductive path leads from the sixth semiconductor region (cathode region) 106 via the third dummy gate 520' and the fourth dummy gate 520" to the fourth semiconductor region (diffusion region) 104 and includes ballasting resistances 526' and 526" coupled in series.

FIG. 6B shows a circuit view of the semiconductor device 600. Similarly as in FIG. 1B, FIG. 3B and FIG. 5B, FIG. 6B shows the p-type (e.g. PMOS) and n-type (e.g. NMOS) devices 131, 132 and the parasitic bipolar devices 131', 132' that may occur in the semiconductor device 600.

The resistors R1 and R2 shown in FIG. 6B may represent, respectively, resistances of the first and second dummy gates 519', 519" and resistances of the third and fourth dummy gates 520', 520" shown in FIG. 6A. In particular, R1 may include or be the resistance 525' of the first dummy gate 519' plus the resistance 525" of the second dummy gate 519", and R2 may include or be the resistance 526' of the third dummy gate 520' plus the resistance 526" of the fourth dummy gate 520".

The resistances 525' and 525" of the first and second dummy gates 519', 519" may have about the same value, or at least one of the resistances 525' and 525" may have a different value.

The resistances 526' and 526" of the third and fourth dummy gates 520', 520" may have about the same value, or at least one of the resistances 526' and 526" may have a different value.

The resistances R1 and R2 in FIG. 6B may have about the same value, or they may have different values.

It should be noted that the FinFET technology based semiconductor devices shown in FIG. 2, FIG. 5A, and FIG. 6A may also be implemented in planar technology, e.g. in a similar manner as semiconductor device 300 shown in FIG. 3A.

Semiconductor devices described herein may be arranged such that PFET (e.g. PMOS) and NFET (e.g. NMOS) devices 131, 132 are arranged in a array-style or checkerboard-like configuration, as is shown in FIG. 7.

FIG. 7 shows an example of a semiconductor arrangement 700 including a first semiconductor device 700' and a second semiconductor device 700". Reference signs that are the same in the previous figures denote the same or similar elements as there and will not be described in detail again here. Reference is made to the description above.

Each of the first and second semiconductor devices 700' includes first through eighth semiconductor regions 101-108 as well as first and second gates 109, 110 which may be configured in a similar or the same manner as in the examples described herein above, e.g. in a similar manner as in one of the semiconductor devices 100, 200, 300, 500, and 600 described herein above.

It is noted that the first and second semiconductor devices 700', 700' of the arrangement 700 are shown to be based on FinFET technology, i.e. including fin structures 111, 112. However, as will be readily understood, the first and second semiconductor devices 700', 700' may alternatively be implemented in planar technology, e.g. in a similar manner as shown in FIG. 3A.

Also, it is noted that the third and fourth semiconductor regions 103, 104 and the sixth and seventh semiconductor regions 106, 107 are arranged in a similar manner as, e.g., in FIG. 1A. However, as will be readily understood, the third and fourth semiconductor regions 103, 104 and the sixth and seventh semiconductor regions 106, 107 may also be arranged such that the third and sixth semiconductor regions 103, 107 (anode and cathode regions) are disposed closer to the interface 151, e.g. in a similar or the same manner as in the semiconductor device 200 of FIG. 2.

The coupling between the first and second gates 109, 110 and the third, fourth, sixth and seventh semiconductor regions 103, 104, 106, 107 is not shown in FIG. 7 for sake of clarity, however it may be similar or the same as in the examples described herein above, e.g. similar or the same as in one of the semiconductor devices 100, 200, 300, 500, and 600 described herein above.

In the semiconductor device arrangement 700 of FIG. 7, the first semiconductor region 101 of the first semiconductor device 700' is disposed adjacent to the second semiconductor region 102 of the second semiconductor device 700", and the second semiconductor region 102 of the first semiconductor device 700' is disposed adjacent to the first semiconductor region 101 of the second semiconductor device 700".

In particular, the first and second semiconductor regions 101, 102 of the first and second semiconductor devices 700', 700" may be arranged in a checkerboard-like arrangement, as shown in FIG. 7. In the semiconductor device arrangement 700, SCR conduction may happen across the original interfaces 151 of 700' and 700"; similarly the new interfaces 751 and 752 may also provide SCR conduction. Thus, the entire checkerboard-like arrangement may provide contiguous SCR conduction.

Thus, the first semiconductor region 101 of the first semiconductor device 700' and the second semiconductor region 102 of the second semiconductor device 700" may have a common interface 751, and also the second semiconductor region 102 of the first semiconductor device 700' and the first semiconductor region 101 of the second semiconductor device 700" may have a common interface 752. The interfaces 751, 752 may be pn-interfaces.

Illustratively, the first and second semiconductor devices 700', 700' may be arranged such that PFET (e.g. PMOS) devices 131 and NFET (e.g. NMOS) devices 132 are arranged in a checkerboard-like configuration.

The semiconductor device arrangement 700 may further include at least one, e.g. a plurality of, contacts 701 which may serve, e.g., as diffusion contacts and/or well contacts. The contacts 701 may, for example, be disposed at a periphery of the semiconductor arrangement 700, as shown.

The semiconductor device arrangement 700 may be configured as an SCR device, e.g. for ESD protection.

An effect of the stacked configuration of the PFET (e.g. PMOS) devices 131 and NFET (e.g. NMOS) devices 132 in the arrangement 700 may be that a time constant of a built-in trigger circuit may be increased.

As an example, FIG. 7 shows an arrangement 700 of two semiconductor devices 700', 700" that are arranged to form, illustratively, a 2×2 checkerboard. Semiconductor devices 700', 700" may be considered as unit cells of the checkerboard. As will be readily understood, semicoductor devices described herein may be arranged to form arrangements, e.g. "checkerboard" arrangements, of other (e.g. larger) dimension, e.g. a checkerboard of dimension N×M (where N and M may be any integer number greater than or equal to one, and where N and M may be the same or may be different numbers), e.g. a checkerboard of dimension 2L×2L (where L may be any integer number greater than or equal to one).

In case of an ESD event, efficient current ballasting may be desirable to safely discharge an ESD surge. In particular, uniform current distribution of an ESD current may be desirable.

FIG. 8A and FIG. 8B show a gridded metallization approach for an improved current ballasting, which may, e.g., be used in connection with one or more ESD protection devices, for example one or more of the SCR devices including current ballasting as described herein.

FIG. 8A is a perspective view of a semiconductor device 800. The semiconductor device 800 may include a semiconductor substrate 840, e.g. a semiconductor bulk substrate, e.g. a silicon bulk substrate. A region 860 may be disposed over the substrate 840. The region 860 may be an electrically insulating region. The region 860 may, e.g., be a shallow trench isolation (STI) region. A plurality of semiconductor fin structures or fins 870 may be disposed over the substrate 840. The fin structures or fins 870 may be disposed at least partially between the region (e.g. electrically insulating region, e.g. STI region) 860. The fin structures 870 may be substantially parallel to one another. The fin structures 870 may be aligned in a first direction, e.g. the "y" direction in FIG. 8A. Each fin structure 870 may include a plurality of diffusion regions contacted via diffusion contacts (e.g. bar contacts). A first diffusion contact 801a is shown that may contact first diffusion regions of the fin structures 870, and a second diffusion contact 801b is shown that may contact second diffusion regions of the fin structures 870. Additional diffusion contacts may be provided that may be coupled to additional diffusion regions of the fin structures 870 (hidden from view in FIG. 8A). The diffusion contacts, e.g. first and second diffusion contacts 801a and 801b, may be aligned in a second direction, which may be substantially perpendicular to the first direction, e.g. the "x" direction in FIG. 8A. The diffusion contacts may include, e.g. consist of, an electrically conductive material such as, e.g., a metal or metal alloy, or the like.

A plurality of gates may be disposed over the fin structures 870 and may be disposed between the diffusion contacts. A first gate 872*a* is shown that may be disposed over the fin structures 870 and may be disposed between the first diffusion contact 801*a* and the second diffusion contact 801*b*, and a second gate 872*b* is shown that may be disposed over the fin structures 870 and may be disposed between the second diffusion contact 801*b* and a third diffusion contact (hidden from view in FIG. 8A). Additional gates may be provided (hidden from view in FIG. 8A). The gates, e.g. first and second gates 872*a* and 872*b*, may be aligned in the second direction, e.g. the "x" direction in FIG. 8A. The gates may include, e.g. consist of, an electrically conductive material such as, e.g., polysilicon, a metal or metal alloy, or the like.

The gates, e.g. first and second gates 872*a*, 872*b* and possibly additional gates, may be coupled to, e.g. in contact, e.g. direct physical contact, with, at least one gate contact 801*c*. The gate contact 801*c* may be aligned in the first direction, i.e. the "y" direction in FIG. 8A. The gate contact 801*c* may be coupled to, e.g. in contact, e.g. direct physical contact, with, a respective contact region, e.g. end region, of each of the gates. The gate contact 801*c* may include, e.g. consist of, an electrically conductive material such as, e.g., a metal or metal alloy, or the like.

The diffusion contacts and/or gate contact may be coupled to respective interconnects disposed in a higher metallization level, e.g. "Metal 1" as shown in FIG. 8A, e.g. by means of one or more vias disposed in a corresponding via level, referred to as "Via 1" in FIG. 8A.

For example, the first diffusion contact 801*a* may be coupled to at least one first interconnect 811*a* by means of at least one first via 812*a*, the second diffusion contact 801*b* may be coupled to at least one second interconnect 811*b* by means of at least one second via 812*b*, and the gate contact 801*c* may be coupled to at least one third interconnect 811*c* via at least one third via 812*c*.

The interconnects in the higher metallization level, e.g. first through third interconnects 811*a*, 811*b*, 811*c* in metallization level M1 may be aligned in the first direction, i.e. the "y" direction in FIG. 8A. The vias, e.g. first through third vias 812*a*, 812*b*, 812*c* may run in a direction (referred to as "z" direction in FIG. 8A) that is substantially perpendicular to the first direction, i.e. "y" direction in FIG. 8A, and substantially perpendicular to the second direction, i.e. "x" direction in FIG. 8A.

The interconnects in the higher metallization level, e.g. e.g. first through third interconnects 811*a*, 811*b*, 811*c* in metallization level M1, may be coupled to additional interconnects in a still higher metallization level (e.g. metallization level M2), e.g. by means of one or more additional vias (not shown, see e.g. FIG. 8B). The additional interconnects may be aligned in the second direction, i.e. "x" direction in FIG. 8A.

The diffusion regions of the fin structures 870 may be coupled to one or more electrical potentials, e.g. power supply potentials, e.g. VDD or VSS, via the diffusion contacts, e.g. first and second diffusion contacts 801*a*, 801*b*, the first and second vias 812*a*, 812*b*, the interconnects in the higher metallization level, e.g. first and second interconnects 811*a*, 811*b*, 811*c* in metallization level M1, and optionally additional vias and additional interconnects in still higher metallization levels (not shown).

The gates, e.g. first and second gates 872*a*, 872*b*, disposed over the fin structures 870 may be coupled to one or more electrical potentials, e.g. gate control potentials, via the gate contact 801*c*, the at least one third via 812*c*, the at least one third interconnect 811*c*, and optionally additional vias and additional interconnects in still higher metallization levels (not shown).

FIG. 8B is a schematic perspective view of an arrangement 850 including a plurality of interconnects (e.g. electrically conductive lines) disposed in three different, e.g. subsequent, metallization levels, e.g. metallization levels M(n−1), M(n), and M(n+1) (n being an integer number), e.g. metallization levels M0, M1, and M2, and a plurality of corresponding vias forming electrical couplings. The interconnects may be configured for power supply to one or more devices and/or for signal transfer to and/or from one or more devices.

For example, one or more interconnects 801 may be disposed in metallization level M0, one or more interconnects 811 may be disposed in metallization level M1, and one or more interconnects 821 may be disposed in metallization level M2.

Interconnects 801 disposed in metallization level M0 may be parallel to one another. Interconnects 811 disposed in metallization level M1 may be parallel to one another. Interconnects 821 disposed in metallization level M2 may be parallel to one another.

The interconnects 801 may be disposed in a same level or plane. The interconnects 811 may be disposed in a same level or plane. The interconnects 821 may be disposed in a same level or plane.

The interconnects 801 may be aligned in a first direction. The interconnects 811 may be aligned in a second direction. The second direction may be at least substantially perpendicular to the first direction.

The interconnects 811 may cross the interconnects 801.

The interconnects 821 may be aligned in a third direction. The third direction may be the same direction as the first direction.

The interconnects 821 may cross the interconnects 811.

One or more vias 802 disposed below metallization level M0 may couple one or more of the interconnects 801 disposed in metallization level M1 to one or more elements disposed below. The one or more vias 802 may be in contact, e.g. direct physical contact, with the one or more interconnects 801.

One or more vias 812 disposed between metallization level M0 and metallization level M1 may couple one or more of the interconnects 801 disposed in metallization level M0 to one or more of the interconnects 811 disposed in metallization level M1. The one or more vias 812 may be in contact, e.g. direct physical contact, with the one or more interconnects 801 and/or the interconnects 811. The one or more vias 812 may be disposed at respective cross-points between the interconnects 801 and the interconnects 811.

One or more vias 822 disposed between metallization level M1 and metallization level M2 may couple one or more of the interconnects 811 disposed in metallization level M1 to one or more of the interconnects 821 in metallization level M2. The one or more vias 822 may be in contact, e.g. direct physical contact, with the one or more interconnects 811 and/or the interconnects 821. The one or more vias 822 may be disposed at respective cross-points between the interconnects 811 and the interconnects 821.

Interconnects disposed in a given metallization level (e.g. M(n)) may be aligned perpendicular to interconnects disposed in the preceding metallization level (M(n−1)) as well as interconnects in the subsequent metallization level (M(n+1)).

For example, as shown in FIG. 8B, the interconnects 811 in metallization level M1 may be aligned perpendicular to the interconnects 801 in metallization level M0 and may be aligned perpendicular to the interconnects 821 in metallization level M2. The interconnects 801 in metallization level M0 may be aligned in the same direction as the interconnects 821 in metallization level M2.

An interconnect 801 disposed in metallization level M0 may be coupled to every other interconnect 811 disposed in metallization level M1. An interconnect 811 disposed in metallization level M1 may be coupled to every other interconnect 821 in metallization level M2.

Illustratively, the arrangement 850 including interconnects 801, 811, and 821 in metallization levels M0, M1, and M2 forms a grid array of orthogonal interconnects. This gridded metallization approach may allow for improved current ballasting. For example, the arrangement 850 may allow for uniform current distribution, e.g. of an ESD current, and also current ballasting by means of a self-aligned grid of resistors made from BEOL (back end of line) layers. Thus, the gridded metallization approach may, for example, further improve ESD protection performance of an ESD protection device that may be coupled to the arrangement 850. For example, an ESD current may be distributed over at least some, e.g. all, of the interconnects 801, 811, and 821 of the arrangement 850. Thus, at least some, e.g. all, of the interconnects 801, 811, and 821 may provide resistance and thus contribute to current ballasting during an ESD event.

EXAMPLES

The following examples pertain to further embodiments.

Example 1 is a semiconductor device including: a first semiconductor region of a first conductivity type; a second semiconductor region of a second conductivity type disposed adjacent to the first semiconductor region; a third semiconductor region and a fourth semiconductor region of the second conductivity type disposed over or at least partially within the first semiconductor region, a fifth semiconductor region of the first conductivity type disposed between the third and fourth semiconductor regions, and a first gate disposed over the fifth semiconductor region; a sixth semiconductor region and a seventh semiconductor region of the first conductivity type disposed over or at least partially within the second semiconductor region, an eighth semiconductor region of the second conductivity type disposed between the sixth and seventh semiconductor regions, and a second gate disposed over the eighth semiconductor region; wherein the third semiconductor region is coupled to a first region of the first gate, and the seventh semiconductor region is coupled to a second region of the first gate; and wherein the fourth semiconductor region is coupled to a first region of the second gate and the sixth semiconductor region is coupled to a second region of the second gate.

In Example 2, the semiconductor device of Example 1 can optionally include a first electrical connection coupling the third semiconductor region to the first region of the first gate.

In Example 3, the first electrical connection of the semiconductor device of Example 2 may be in contact with the first region of the first gate.

In Example 4, the first electrical connection of the semiconductor device of Example 2 may be in direct physical contact with the first region of the first gate.

In Example 5, the semiconductor device of any one of Examples 1-4 can optionally include a second electrical connection coupling the seventh semiconductor region to the second region of the first gate.

In Example 6, the second electrical connection of the semiconductor device of Example 5 may be in contact with the second region of the first gate.

In Example 7, the second electrical connection of the semiconductor device of Example 6 may be in direct physical contact with the second region of the first gate.

In Example 8, the semiconductor device of any one of Examples 1-7 can optionally include a third electrical connection coupling the fourth semiconductor region to the first region of the second gate.

In Example 9, the third electrical connection of the semiconductor device of Example 8 may be in contact with the second region of the second gate.

In Example 10, the third electrical connection of the semiconductor device of Example 9 may be in direct physical contact, with the second region of the second gate.

In Example 11, the semiconductor device of any one of Examples 1-10 can optionally include a fourth electrical connection coupling the sixth semiconductor region to the second region of the second gate.

In Example 12, the fourth electrical connection of the semiconductor device of Example 11 may be in contact with the second region of the second gate.

In Example 13, the fourth electrical connection of the semiconductor device of Example 11 may be in direct physical contact with the second region of the second gate.

In Example 14, the first semiconductor region of the semiconductor device of any one of Examples 1-13 may be a first well region and the second semiconductor region of the semiconductor device of any one of Examples 1-13 may be a second well region.

In Example 15, the first well region of the semiconductor device of Example 14 may have a lower dopant concentration than the seventh semiconductor region, and the second well region may have a lower dopant concentration than the eighth semiconductor region.

In Example 16, the first and second regions of the first gate of the semiconductor device of any one of Examples 1-15 may be disposed at opposite ends of the first gate, and the first and second regions of the second gate of the semiconductor device of any one of Examples 1-15 may be disposed at opposite ends of the second gate.

In Example 17, the first semiconductor region of the semiconductor device of any one of Examples 1-16 may have a lower dopant concentration than the third and fourth semiconductor regions, and the second semiconductor region of the semiconductor device of any one of Examples 1-16 may have a lower dopant concentration than the seventh and eighth semiconductor regions.

In Example 18, the semiconductor device of any one of Examples 1-17 can optionally include a ninth semiconductor region of the first conductivity type disposed over or at least partially within the first semiconductor region and electrically coupled to the third semiconductor region, and a tenth semiconductor region of the second conductivity type disposed over or at least partially within the second semiconductor region and electrically coupled to the seventh semiconductor region.

In Example 19, the semiconductor device of any one of Examples 1-18 can optionally include at least one first semiconductor fin structure and at least one second semiconductor fin structure, and the at least one first semiconductor fin structure may include the third to fifth semiconductor regions, and the at least one second semiconductor fin structure may include the sixth to eighth semiconductor regions.

In Example 20, the semiconductor device of any one of Examples 1-18 can optionally include a plurality of first semiconductor fin structures and a plurality of second semiconductor fin structures, and the plurality of first semiconductor fin structures may include the third to fifth semiconductor regions, and the plurality of second semiconductor fin structures may include the sixth to eighth semiconductor regions.

In Example 21, the semiconductor device of Example 20 can optionally include a first contact disposed over the third semiconductor region, wherein a first end of the first contact is coupled to a first power supply terminal, wherein a tapping point for a gate bias voltage of the first gate is disposed at a second end of the first contact that is proximate the second region of the first gate; a second contact disposed over the sixth semiconductor region, wherein a first end of the second contact is coupled to a second power supply terminal, wherein a tapping point for a gate bias voltage of the second gate is disposed at a second end of the second contact that is proximate the first region of the second gate; a third contact disposed over the fourth semiconductor region, wherein the first region of the second gate is coupled to an end of the third contact that is proximate the second region of the first gate; and a fourth contact disposed over the seventh semiconductor region, wherein the second region of the first gate is coupled to an end of the fourth contact that is proximate the first region of the second gate.

In Example 22, at least one of the first and second gates of the semiconductor device of any one of Examples 1-21 may include polysilicon.

In Example 23, at least one of the first and second gates of the semiconductor device of any one of Examples 1-21 may consist of polysilicon.

In Example 24, at least one of the first and second gates of the semiconductor device of any one of Examples 1-21 may include a metal or metal alloy.

In Example 25, at least one of the first and second gates of the semiconductor device of any one of Examples 1-21 may include a thin metal film.

In Example 26, at least one of the first and second gates of the semiconductor device of any one of Examples 1-21 may consist of a thin metal film.

In Example 27, the semiconductor device of any one of Examples 1-26 can optionally be configured as a semiconductor controlled rectifier.

In Example 28, the third semiconductor region of the semiconductor device of Example 27 may be configured as an anode region of the semiconductor controlled lectifier and the sixth semiconductor region may be configured as a cathode region of the semiconductor controlled rectifier.

In Example 29, the semiconductor device of any one of Examples 27-28 can optionally be configured as a silicon controlled rectifier.

In Example 30, the semiconductor device of any one of Examples 1-29 can optionally be configured as an electrostatic discharge protection device.

In Example 31, the first conductivity type in the semiconductor device of any one of Examples 1-30 may be an n-type conductivity type and the second conductivity type in the semiconductor device of any one of Examples 1-30 may be a p-type conductivity type.

In Example 32, at least one of the semiconductor regions of the semiconductor device of any one of Examples 1-31 may include silicon.

In Example 32, at least one of the semiconductor regions of the semiconductor device of any one of Examples 1-31 may consist of silicon.

In Example 33, the third semiconductor region of the semiconductor device of any one of Examples 1-32 may be disposed closer to an interface between the first and second semiconductor regions than the fourth semiconductor region, and the sixth semiconductor region of the semiconductor device of any one of Examples 1-32 may be disposed closer to the interface than the seventh semiconductor region.

In Example 34, the first through eighth semiconductor regions may include silicon.

In Example 35, the first through eighth semiconductor regions may consist of silicon.

In Example 36, the semiconductor device of any one of Examples 1-35 can optionally include at least one dummy gate coupled between the third semiconductor region and the first region of the first gate, or at least one dummy gate coupled between the sixth semiconductor region and the second region of the second gate.

In Example 37, the semiconductor device of any one of Examples 1-35 can optionally include at least one dummy gate coupled between the third semiconductor region and the first region of the first gate, and at least one dummy gate coupled between the sixth semiconductor region and the second region of the second gate.

In Example 39, the semiconductor device of any one of Examples 1-35 can optionally include a first dummy gate and a second dummy gate coupled between the third semiconductor region and the first region of the first gate, wherein the third semiconductor region is coupled to a first region of the first dummy gate, the first region of the first gate is coupled to a first region of the second dummy gate, and a second region of the first dummy gate is coupled to a second region of the second dummy gate; and a third dummy gate and a fourth dummy gate coupled between the sixth semiconductor region and the second region of the second gate, wherein a first region of the third dummy gate is coupled to a first region of the fourth dummy gate, the sixth semiconductor region is coupled to a second region of the third dummy gate, and a second region of the fourth dummy gate is coupled to the second region of the second gate.

In Example 40, the first and second regions of a respective dummy gate of the first through fourth dummy gates of the semiconductor device of Example 39 may be disposed at opposite ends of the respective dummy gate.

Example 41 is a semiconductor device including: a first semiconductor region of a first conductivity type; a second semiconductor region of a second conductivity type disposed adjacent to the first semiconductor region; a third semiconductor region and a fourth semiconductor region of the second conductivity type disposed over or at least partially within the first semiconductor region, a fifth semiconductor region of the first conductivity type disposed between the third and fourth semiconductor regions, and a first gate disposed over the fifth semiconductor region; a sixth semiconductor region and a seventh semiconductor region of the first conductivity type disposed over or at least partially within the second semiconductor region, an eighth semiconductor region of the second conductivity type disposed between the sixth and seventh semiconductor regions, and a second gate disposed over the eighth semiconductor region; a plurality of dummy gates; a first electrically conductive path leading from the third semiconductor region via a dummy gate of the plurality of dummy gates to the seventh semiconductor region, and a second electrically conductive path leading from the sixth semiconductor region via another dummy gate of the plurality of dummy gates to the fourth semiconductor region.

In Example 42, the plurality of dummy gates of the semiconductor device of Example 41 may include a first, second, third and fourth dummy gate, wherein the first electrically conductive path may lead from the third semiconductor region to the seventh semiconductor region via the first dummy gate and the second dummy gate coupled in series to the first dummy gate, and wherein the second electrically conductive path may lead from the sixth semiconductor region to the fourth semiconductor region via the third dummy gate and the fourth dummy gate coupled in series to the third dummy gate.

In Example 43, the first and second dummy gates of the semiconductor device of Example 42 may be disposed at opposite sides of the first gate, and the third and fourth dummy gates of the semiconductor device of Example 42 may be disposed at opposite sides of the second gate.

In Example 44, the third semiconductor region of the semiconductor device of any one of Examples 42-43 may be coupled to a first region of the first dummy gate, the seventh semiconductor region may be coupled to a first region of the second dummy gate, a second region of the first dummy gate may be coupled to a second region of the second dummy gate, a first region of the third dummy gate may be coupled to a first region of the fourth dummy gate, the sixth semiconductor region may be coupled to a second region of the third dummy gate, and a second region of the fourth dummy gate may be coupled to the fourth semiconductor region.

In Example 45, the first and second regions of a respective dummy gate of the first through fourth dummy gates of the semiconductor device of Example 44 may be disposed at opposite ends of the respective dummy gate.

In Example 46, the semiconductor device of any one of Examples 44-45 can optionally include a first electrical connection coupling the third semiconductor region to the first region of the first dummy gate.

In Example 47, the first electrical connection of the semiconductor device of Example 46 is in contact with the first region of the first dummy gate.

In Example 48, the first electrical connection of the semiconductor device of Example 46 is in direct physical contact with the first region of the first dummy gate.

In Example 49, the semiconductor device of any one of Examples 44 to 48 can optionally include a second electrical connection coupling the seventh semiconductor region to the first region of the second dummy gate.

In Example 50, the second electrical connection of the semiconductor device of Example 49 is in contact with the first region of the second dummy gate.

In Example 51, the second electrical connection of the semiconductor device of Example 49 is in direct physical contact with the first region of the second dummy gate.

In Example 52, the semiconductor device of any one of Examples 41 to 51 can optionally include a third electrical connection coupling the fourth semiconductor region to the second region of the fourth dummy gate.

In Example 53, the third electrical connection of the semiconductor device of Example 52 is in contact with the second region of the fourth dummy gate.

In Example 54, the third electrical connection of the semiconductor device of Example 52 is in direct physical contact with the second region of the fourth dummy gate.

In Example 55, the semiconductor device of any one of Examples 44 to 54 can optionally include a fourth electrical connection coupling the sixth semiconductor region to the second region of the third dummy gate.

In Example 56, the fourth electrical connection of the semiconductor device of Example 55 is in contact with the second region of the third dummy gate.

In Example 57, the fourth electrical connection of the semiconductor device of Example 55 is in direct physical contact with the second region of the third dummy gate.

In Example 58, the first semiconductor region of the semiconductor device of any one of Examples 41 to 57 is a first well region and the second semiconductor region of the semiconductor device of any one of Examples 41 to 57 is a second well region.

In Example 59, the first well region in the semiconductor device of Example 58 has a lower dopant concentration than the seventh semiconductor region, and the second well region in the semiconductor device of Example 58 has a lower dopant concentration than the eighth semiconductor region.

In Example 60, the first and second regions of the first gate of the semiconductor device of any one of Examples 41 to 59 are disposed at opposite ends of the first gate, and the first and second regions of the second gate of the semiconductor device of any one of Examples 41 to 59 are disposed at opposite ends of the second gate.

In Example 61, the first semiconductor region of the semiconductor device of any one of Examples 41 to 60 has a lower dopant concentration than the third and fourth semiconductor regions, and wherein the second semiconductor region has a lower dopant concentration than the seventh and eighth semiconductor regions.

In Example 62, the semiconductor device of any one of Examples 41 to 61 can optionally include a ninth semiconductor region of the first conductivity type disposed over or at least partially within the first semiconductor region and coupled to the third semiconductor region, and a tenth semiconductor region of the second conductivity type disposed over or at least partially within the second semiconductor region and coupled to the seventh semiconductor region, In Example 63, the semiconductor device of any one of Example 41 to 62 can optionally include at least one first semiconductor fin structure and at least one second semiconductor fin structure, wherein the at least one first semiconductor fin structure includes the third to fifth semiconductor regions, and wherein the at least one second semiconductor fin structure includes the sixth to eighth semiconductor regions.

In Example 64, the semiconductor device of any one of Examples 41 to 62 can optionally include a plurality of first semiconductor fin structures and a plurality of second semiconductor fin structures, wherein the plurality of first semiconductor fin structures includes the third to fifth semiconductor regions, and the plurality of second semiconductor fin structures includes the sixth to eighth semiconductor regions.

In Example 65, the semiconductor device of Example 64 can optionally include: a first contact disposed over the third semiconductor region and coupled to a first power supply terminal; a second contact disposed over the sixth semiconductor region and coupled to a second power supply terminal, a third contact disposed over the fourth semiconductor region, wherein the second region of the fourth dummy gate is coupled to the third contact; and a fourth contact disposed over the seventh semiconductor region, wherein the first region of the second dummy gate is coupled to the fourth contact.

In Example 66, a center region of the first contact of the semiconductor device of Example 65 is coupled to the first region of the first dummy gate, a center region of the second contact of the semiconductor device of Example 65 is coupled to the second region of the third dummy gate, a center region of the third contact of the semiconductor device of Example 65 is coupled to the second region of the fourth dummy gate, and a center region of the fourth contact of the semiconductor device of Example 65 is coupled to the first region of the second dummy gate.

In Example 67, at least one of the first and second gates of the semiconductor device of any one of Examples 41 to 66 includes polysilicon.

In Example 68, at least one of the first and second gates of the semiconductor device of any one of Examples 41 to 66 consists of polysilicon.

In Example 69, at least one of the first and second gates of the semiconductor device of any one of Examples 41 to 66 includes a metal or metal alloy.

In Example 70, at least one of the first and second gates of the semiconductor device of any one of Examples 41 to 66 consists of a metal or metal alloy.

In Example 71, at least one of the first and second gates of the semiconductor device of any one of Examples 41 to 66 includes a thin metal film.

In Example 72, at least one of the dummy gates of the semiconductor device of any one of Examples 41 to 71, includes polysilicon.

In Example 73, at least one of the dummy gates of the semiconductor device of any one of Examples 41 to 71, consists of polysilicon.

In Example 74, at least one of the dummy gates of the semiconductor device of any one of Examples 41 to 71 includes a metal or metal alloy.

In Example 74, at least one of the dummy gates of the semiconductor device of any one of Examples 41 to 71 consists of a metal or metal alloy.

In Example 76, at least one of the dummy gates of the semiconductor device of any one of Examples 41 to 71 includes a thin metal film.

In Example 77, the semiconductor device of any one of Examples 41 to 76 may be configured as a semiconductor controlled rectifier.

In Example 78, the third semiconductor region of the semiconductor device of Example 77 may be configured as an anode region of the semiconductor controlled rectifier and the sixth semiconductor region of the semiconductor device of Example 77 may be configured as a cathode region of the semiconductor controlled rectifier.

In Example 79, the semiconductor device of Example 77 or 78 may be configured as a silicon controlled rectifier.

In Example 80, the semiconductor device of any one of Examples 41 to 79 may be configured as an electrostatic discharge protection device.

In Example 81, the first conductivity type in the semiconductor device of any one of Examples 41 to 80 may be an n-type conductivity type and the second conductivity type in the semiconductor device of any one of Examples 41 to 80 may be a p-type conductivity type.

In Example 82, at least one of the first through eighth semiconductor regions in the semiconductor device of any one of Examples 41 to 81 includes silicon.

In Example 83, at least one of the first through eighth semiconductor regions in the semiconductor device of any one of Examples 41 to 81 consists of silicon.

In Example 84, the first through eighth semiconductor regions in the semiconductor device of any one of Examples 41 to 81 include silicon.

In Example 85, the first through eighth semiconductor regions in the semiconductor device of any one of Examples 41 to 81 consist of silicon.

In Example 86, the third semiconductor region in the semiconductor device of any one of Examples 41 to 85 is disposed closer to an interface between the first and second semiconductor regions than the fourth semiconductor region, and the sixth semiconductor region in the semiconductor device of any one of Examples 41 to 85 is disposed closer to the interface than the seventh semiconductor region.

Example 87 is a semiconductor device arrangement including: at least a first semiconductor device of any one of Examples 1-86 and a second semiconductor device of any one of Examples 1-86, wherein the first semiconductor region of the first semiconductor device is disposed adjacent to the second semiconductor region of the second semiconductor device, and wherein the second semiconductor region of the first semiconductor device is disposed adjacent to the first semiconductor region of the second semiconductor device.

In Example 88, the first and second semiconductor regions of the first and second semiconductor devices of the semiconductor device arrangement of Example 87 are arranged in a checkerboard-like arrangement.

Example 89 is a semiconductor device arrangement, including: a plurality of first interconnects disposed in a first metallization level and aligned in a first direction; a plurality of second interconnects disposed in a second metallization level and aligned in a second direction, wherein at least a number of the second interconnects in the plurality of second interconnects are coupled to at least some of the first interconnects; a semiconductor device coupled to at least a number of the first interconnects in the plurality of first interconnects, wherein the semiconductor device is configured as an electrostatic discharge protection device.

In Example 90, the semiconductor device arrangement of Example 89 can optionally include a plurality of third interconnects disposed in a third metallization level and aligned in the first direction, wherein the second metallization level is disposed between the first and third metallization levels, and wherein the third interconnects are coupled to at least a number of the second interconnects.

In Example 91, in the semiconductor device arrangement of any one of Examples 89 to 90 the first direction is substantially perpendicular to the second direction.

In Example 92, the semiconductor device in the semiconductor device arrangement of any one of Examples 89 to 91 is configured according to any one of Examples 1 to 86.

While the invention has been particularly shown and described with reference to specific aspects of this disclosure, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, comprising:
   a first semiconductor region of a first conductivity type and a second semiconductor region of a second conductivity type disposed adjacent to the first semiconductor region;
   a third semiconductor region and a fourth semiconductor region of the second conductivity type disposed over or at least partially within the first semiconductor region, a fifth semiconductor region of the first conductivity type disposed between the third and fourth semiconductor regions, and a first gate disposed over the fifth semiconductor region; wherein the fifth semiconductor region is of the same type as the first semiconductor region and the fifth semiconductor region comprises a dopant concentration smaller than the first semiconductor region;
   a sixth semiconductor region and a seventh semiconductor region of the first conductivity type disposed over or at least partially within the second semiconductor region, an eighth semiconductor region of the second conductivity type disposed between the sixth and seventh semiconductor regions, and a second gate disposed over the eighth semiconductor region; wherein the eighth semiconductor region is of the same type as the second semiconductor region and the eighth semiconductor region comprises a dopant concentration smaller than the second semiconductor region;

wherein the third semiconductor region is coupled to a first region of the first gate, and the seventh semiconductor region is coupled to a second region of the first gate; and wherein the fourth semiconductor region is coupled to a first region of the second gate and the sixth semiconductor region is coupled to a second region of the second gate.

2. The semiconductor device of claim 1, wherein the first semiconductor region is a first well region and the second semiconductor region is a second well region.

3. The semiconductor device of claim 1, wherein the first and second regions of the first gate are disposed at opposite ends of the first gate, and wherein the first and second regions of the second gate are disposed at opposite ends of the second gate.

4. The semiconductor device of claim 1, further comprising a ninth semiconductor region of the first conductivity type disposed over or at least partially within the first semiconductor region and coupled to the third semiconductor region, and a tenth semiconductor region of the second conductivity type disposed over or at least partially within the second semiconductor region and coupled to the seventh semiconductor region.

5. The semiconductor device of claim 1, further comprising at least one first semiconductor fin structure and at least one second semiconductor fin structure, wherein the at least one first semiconductor fin structure comprises the third to fifth semiconductor regions, and wherein the at least one second semiconductor fin structure comprises the sixth to eighth semiconductor regions.

6. The semiconductor device of claim 1, further comprising a plurality of first semiconductor fin structures and a plurality of second semiconductor fin structures, wherein the plurality of first semiconductor fin structures comprises the third to fifth semiconductor regions, and the plurality of second semiconductor fin structures comprises the sixth to eighth semiconductor regions.

7. The semiconductor device of claim 6, further comprising:

a first contact disposed over the third semiconductor region, wherein a first end of the first contact is coupled to a first power supply terminal, and wherein a tapping point for a gate bias voltage of the first gate is disposed at a second end of the first contact that is proximate the second region of the first gate;

a second contact disposed over the sixth semiconductor region, wherein a first end of the second contact is coupled to a second power supply terminal, and wherein a tapping point for a gate bias voltage of the second gate is disposed at a second end of the second contact that is proximate the first region of the second gate;

a third contact disposed over the fourth semiconductor region, wherein the first region of the second gate is coupled to an end of the third contact that is proximate the second region of the first gate; and a fourth contact disposed over the seventh semiconductor region, wherein the second region of the first gate is coupled to an end of the fourth contact that is proximate the first region of the second gate.

8. The semiconductor device of claim 1, wherein at least one of the first and second gates comprises a thin metal film.

9. The semiconductor device of claim 1, configured as a semiconductor controlled rectifier.

10. The semiconductor device of claim 1, configured as an electrostatic discharge protection device.

11. The semiconductor device of claim 1, wherein the first conductivity type is an n-type conductivity type and the second conductivity type is a p-type conductivity type.

12. The semiconductor device of claim 1, wherein the third semiconductor region is disposed closer to an interface between the first and second semiconductor regions than the fourth semiconductor region, and wherein the sixth semiconductor region is disposed closer to the interface than the seventh semiconductor region.

13. The semiconductor device of claim 1, wherein the fifth semiconductor region is disposed above the first semiconductor region, and wherein the eighth semiconductor region is disposed above the second semiconductor region.

* * * * *